United States Patent
Takaya et al.

(10) Patent No.: US 11,251,375 B2
(45) Date of Patent: Feb. 15, 2022

(54) WHILE ORGANIC EL ELEMENT

(71) Applicant: CANON KABUSHIKI KAISHA, Tokyo (JP)

(72) Inventors: Itaru Takaya, Atsugi (JP); Naoki Yamada, Inagi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 16/683,773

(22) Filed: Nov. 14, 2019

(65) Prior Publication Data
US 2020/0161558 A1 May 21, 2020

(30) Foreign Application Priority Data

Nov. 20, 2018 (JP) .............................. JP2018-217283
Jun. 28, 2019 (JP) .............................. JP2019-121417

(51) Int. Cl.
*H01L 51/00* (2006.01)
*H01L 51/50* (2006.01)
*H01L 27/32* (2006.01)

(52) U.S. Cl.
CPC ...... *H01L 51/0054* (2013.01); *H01L 27/3213* (2013.01); *H01L 51/0055* (2013.01); *H01L 51/5004* (2013.01); *H01L 51/5096* (2013.01); H01L 2251/5361 (2013.01); H01L 2251/552 (2013.01)

(58) Field of Classification Search
CPC ............. H01L 51/0054; H01L 51/0055; H01L 51/5004; H01L 51/504; H01L 2251/552; H01L 2251/5361
See application file for complete search history.

(56) References Cited

U.S. PATENT DOCUMENTS

2013/0087773 A1* 4/2013 Suzuki ................ H01L 51/5036
 257/40
2016/0133846 A1* 5/2016 Ishii ....................... C09K 11/06
 345/76

FOREIGN PATENT DOCUMENTS

| JP | 2008-270190 A | 11/2008 | |
| JP | 2014-22205 A | 2/2014 | |
| JP | 2014022205 A * | 2/2014 | |
| JP | 2016-519834 A | 7/2016 | |
| WO | 13/150909 A1 | 10/2013 | |
| WO | WO-2014147006 A1 * | 9/2014 | ......... H01L 51/0054 |

* cited by examiner

*Primary Examiner* — Marcos D. Pizarro
*Assistant Examiner* — Antonio B Crite
(74) *Attorney, Agent, or Firm* — Canon U.S.A., Inc., IP Division

(57) ABSTRACT

A white organic electroluminescent (EL) element including an anode, a cathode, and a light-emitting layer disposed between the anode and the cathode. The light-emitting layer includes a first light-emitting layer and a second light-emitting layer. The first light-emitting layer and the second light-emitting layer each contain a host material and a light-emitting dopant material. The first light-emitting layer contains, as the light-emitting dopant material, a green-light-emitting dopant material and a blue-light-emitting dopant material and is a dual-color light-emitting layer that emits green light and blue light. The second light-emitting layer contains, as the light-emitting dopant material, a red-light-emitting dopant material and a green-light-emitting dopant material and is a dual-color light-emitting layer that emits red light and green light.

25 Claims, 11 Drawing Sheets

WHILE ORGANIC EL ELEMENT

BACKGROUND

Field of the Invention

The present disclosure relates to a white organic EL element that emits white light.

Description of the Related Art

In recent years, full-color light-emitting arrays including organic electroluminescent (EL) elements have been intensively studied and developed. Full-color light-emitting arrays are produced by the following two methods. In one method, different light-emitting layers are allocated to pixels (elements). In the other method, a white organic EL element including a white-light-emitting layer and red, green, and blue color filters allocated to pixels is used. Such a white organic EL element is known to emit white light through the use of light-emitting dopants of three colors: red, green, and blue.

Japanese Patent Laid-Open No. 2014-22205 (hereinafter referred to as PTL 1) discloses a white organic EL element including a stack of two light-emitting layers adjacent to each other. The stack includes a blue-light-emitting layer and a dual-color light-emitting layer constituted by a single light-emitting layer containing a red-light-emitting dopant and a green-light-emitting dopant. The light-emitting layers contain the same host material. Due to this configuration, the element has a low drive voltage. In this case, the two light-emitting layers enable light emission of red, green, and blue colors usable for color filters.

Japanese Patent Laid-Open No. 2008-270190 (hereinafter referred to as PTL 2) discloses a white organic EL element including a stack of dual-color light-emitting layers, each being constituted by a single light-emitting layer containing a red-light-emitting dopant and a green-light-emitting dopant, and a single-color blue-light-emitting layer adjacently disposed therebetween. The light-emitting layers contain the same host material. Due to this configuration, the stability of emission chromaticity to drive current variation has been improved.

International Publication No. 13/150909 (hereinafter referred to as PTL 3) discloses a white organic EL element including a stack of three light-emitting layers adjacent to each other. The stack includes, in sequence, a dual-color light-emitting layer constituted by a single light-emitting layer containing a red-light-emitting dopant and a green-light-emitting dopant, a single-color blue-light-emitting layer, and a dual-color light-emitting layer constituted by a single light-emitting layer containing a red-light-emitting dopant and a blue-light-emitting dopant.

PCT Japanese Translation Patent Publication No. 2016-519834 (hereinafter referred to as PTL 4) discloses a white organic EL element including a stack of two light-emitting layers adjacent to each other. The stack includes a red-light-emitting layer and a dual-color light-emitting layer constituted by a single light-emitting layer containing a green-light-emitting dopant and a blue-light-emitting dopant. The light-emitting layers contain different host materials.

While the white organic EL element disclosed in PTL1 has a low drive voltage, there is room for improvement in the balance of red, green, and blue light emissions. When the stacked light-emitting layers contain the same host material and no electron barrier layers are used, the drive voltage of the element is low because there are no barriers for holes and electrons. However, since red light and green light are emitted from the same light-emitting layer, it is difficult to control the quantity of red light emission and the quantity of green light emission, and the luminance of red tends to be higher than that of green.

The white organic EL element disclosed in PTL 2 has a structure including two light-emitting layers that emit light of the same color and a layer that is disposed therebetween and emits light of the complementary color. Thus, the white organic EL element undergoes little change with time in white emission chromaticity and has improved stability, but there is room for improvement in the balance of red, green, and blue light emissions. As in PTL 1, since red light and green light are emitted from the same light-emitting layer, it is difficult to control the quantity of red light emission and the quantity of green light emission, and the luminance of red tends to be higher than that of green.

In the white organic EL element disclosed in PTL 3, as in PTL 1 and PTL 2, since red light and green light are emitted from the same light-emitting layer, it is difficult to control the quantity of red light emission and the quantity of green light emission, and the luminance of red tends to be higher than that of green. In addition, since red light and blue light are also emitted from the same light-emitting layer, the luminance of red tends to be higher than that of blue, but the presence of the single-color blue-light-emitting layer increases the luminance of blue.

In the white organic EL element disclosed in PTL 4, green light and blue light are emitted from the same light-emitting layer. In this case, the control of the quantity of green light emission and the quantity of blue light emission tends to be less difficult than in the case where red light and green light are emitted from the same light-emitting layer, but the luminance of red, which is emitted from the other layer, tends to be high.

As described above, it has been known that the presence of two or more light-emitting dopants in one light-emitting layer provides light emission of two or more colors, and the presence of light-emitting dopants of three colors: red, green, and blue in one light-emitting layer enables light emission of the three colors. However, when two or more light-emitting dopants are present in one light-emitting layer, the light-emitting dopant having a longer wavelength tends to be more luminous, and this tendency is more pronounced at a lower voltage.

SUMMARY

The present disclosure has been made in view of the above disadvantages and provides a white organic EL element that has a low drive voltage, that provides well-balanced red, green, and blue light emissions, and that undergoes little change in white emission chromaticity when subjected to voltage variation.

A white organic electroluminescent (EL) element according to a first embodiment of the present disclosure includes an anode, a cathode, and a light-emitting layer disposed between the anode and the cathode.

The light-emitting layer includes a first light-emitting layer and a second light-emitting layer.

The first light-emitting layer and the second light-emitting layer each contain a host material and a light-emitting dopant material.

The first light-emitting layer contains, as the light-emitting dopant material, a green-light-emitting dopant material and a blue-light-emitting dopant material and is a dual-color light-emitting layer that emits green light and blue light.

The second light-emitting layer contains, as the light-emitting dopant material, a red-light-emitting dopant material and a green-light-emitting dopant material and is a dual-color light-emitting layer that emits red light and green light.

A white organic EL element according to a second embodiment of the present disclosure includes an anode, a cathode, and a light-emitting layer disposed between the anode and the cathode.

The light-emitting layer includes a first light-emitting layer and a second light-emitting layer.

The first light-emitting layer and the second light-emitting layer each contain a host material and a light-emitting dopant material.

The first light-emitting layer and the second light-emitting layer are in contact with each other.

The host material of the first light-emitting layer is the same as the host material of the second light-emitting layer.

The first light-emitting layer contains, as the light-emitting dopant material, a green-light-emitting dopant material and a blue-light-emitting dopant material and is a dual-color light-emitting layer that emits green light and blue light.

The second light-emitting layer contains a red-light-emitting dopant material as the light-emitting dopant material and is a light-emitting layer that emits red light.

Further features of the present disclosure will become apparent from the following description of exemplary embodiments with reference to the attached drawings.

DESCRIPTION OF THE EMBODIMENTS

White Organic EL Element

A white organic EL element according to a first embodiment of the present disclosure includes an anode, a cathode, and a light-emitting layer disposed between the anode and the cathode, and the light-emitting layer includes a first light-emitting layer and a second light-emitting layer. The first light-emitting layer and the second light-emitting layer each contain a host material and a light-emitting dopant material. The first light-emitting layer contains, as the light-emitting dopant material, a green-light-emitting dopant material and a blue-light-emitting dopant material and is a dual-color light-emitting layer that emits green light and blue light. The second light-emitting layer contains, as the light-emitting dopant material, a red-light-emitting dopant material and a green-light-emitting dopant material and is a dual-color light-emitting layer that emits red light and green light.

A white organic EL element according to a second embodiment of the present disclosure includes an anode, a cathode, and a light-emitting layer disposed between the anode and the cathode, and the light-emitting layer includes a first light-emitting layer and a second light-emitting layer. The first light-emitting layer and the second light-emitting layer each contain a host material and a light-emitting dopant material. The first light-emitting layer and the second light-emitting layer are in contact with each other, and the host material of the first light-emitting layer is the same as the host material of the second light-emitting layer. The first light-emitting layer contains, as the light-emitting dopant material, a green-light-emitting dopant material and a blue-light-emitting dopant material and is a dual-color light-emitting layer that emits green light and blue light. The second light-emitting layer contains a red-light-emitting dopant material as the light-emitting dopant material and is a light-emitting layer that emits red light.

Figure 1:
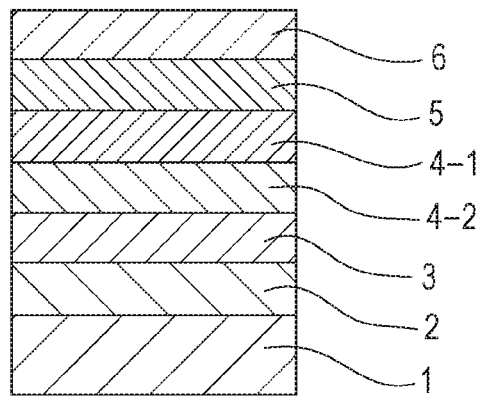
FIG. 1 is a schematic sectional view illustrating an example of a white organic EL element according to an embodiment.

The present disclosure will now be described in more detail with reference to FIG. 1. FIG. 1 is a schematic sectional view of an example of a white organic EL element according to an embodiment. The white organic EL element illustrated in FIG. 1 includes a substrate 1, an anode 2 on the substrate 1, a hole transport layer 3 on the anode 2, a second light-emitting layer 4-2 on the hole transport layer 3, a first light-emitting layer 4-1 on the second light-emitting layer 4-2, an electron transport layer 5 on the first light-emitting layer 4-1, and a cathode 6 on the electron transport layer 5.

The first light-emitting layer 4-1 contains a host material and a light-emitting dopant. The first light-emitting layer 4-1 contains, as the light-emitting dopant, a green-light-emitting dopant and a blue-light-emitting dopant and is a dual-color light-emitting layer that emits green light and blue light. The second light-emitting layer 4-2 contains a host material and a light-emitting dopant. At least a red-light-emitting dopant is contained in the second light-emitting layer 4-2. The two light-emitting layers enable light emission of red, green, and blue colors usable for color filters. While the second light-emitting layer 4-2 is a light-emitting layer nearest to the anode 2 in FIG. 1, this is by way of example only, and the first light-emitting layer 4-1 may be a light-emitting layer nearest to the anode 2. Although not illustrated, three or more light-emitting layers may be present in the present disclosure.

In the present disclosure, a light-emitting layer is an organic compound layer disposed between electrodes and having a light-emitting function. A host material contained in a light-emitting layer is a material that is the main component of the light-emitting layer. More specifically, a host material is a material contained in an amount of 50 mass % or more in a light-emitting layer. A dopant material is a material that is not the main component of a light-emitting layer. More specifically, a dopant material is a material contained in an amount of less than 50 mass % in a light-emitting layer. In the present disclosure, the first light-emitting layer 4-1 contains two light-emitting dopant materials, that is, a green-light-emitting dopant material and a blue-light-emitting dopant material, and the first light-emitting layer 4-1 emits light of two colors: green and blue.

In the present disclosure, among light components extracted from an element, a light-emitting component having a maximum light-emission wavelength of 570 to 650 nm is defined as a red color, and a light-emitting dopant that emits light of such a red color is a red-light-emitting dopant material. Likewise, a light-emitting component having a maximum light-emission wavelength of 490 to 540 nm is defined as a green color, and a light-emitting dopant that emits light of such a green color is a green-light-emitting dopant material. Likewise, a light-emitting component having a maximum light-emission wavelength of 430 to 480 nm is defined as a blue color, and a light-emitting dopant that emits light of such a blue color is a blue-light-emitting dopant material.

In addition to the structure in FIG. 1, a hole injection layer may be disposed between the anode 2 and the hole transport layer 3, and an electron blocking layer may be disposed between the hole transport layer 3 and the light-emitting layer. Furthermore, a hole blocking layer may be disposed between the light-emitting layer and the electron transport layer 5, and an electron injection layer may be disposed between the electron transport layer 5 and the cathode 6. The hole injection layer, the electron blocking layer, the hole blocking layer, and the electron injection layer are appropriately used in the present disclosure as needed. The hole transport layer 3 and the electron transport layer 5 are also appropriately used in the present disclosure as needed.

As described above, the white organic EL element of the present disclosure includes a light-emitting layer stack including at least the first light-emitting layer 4-1 and the second light-emitting layer 4-2 sandwiched between the anode 2 and the cathode 6. When having a feature (1) or (2) and preferably further features (3) to (13) described below, the white organic EL element has a low drive voltage, provides well-balanced red, green, and blue light emissions, and undergoes little change in white emission chromaticity when subjected to voltage variation.

(1) The first light-emitting layer 4-1 and the second light-emitting layer 4-2 each contain a host material and a light-emitting dopant material. The first light-emitting layer 4-1 contains, as the light-emitting dopant material, a green-light-emitting dopant material and a blue-light-emitting dopant material and is a dual-color light-emitting layer that emits green light and blue light. The second light-emitting layer 4-2 contains, as the light-emitting dopant material, a red-light-emitting dopant material and a green-light-emitting dopant material and is a dual-color light-emitting layer that emits red light and green light.

As described above, the presence of two or more light-emitting dopants in one light-emitting layer can provide light emission of two or more colors, but the light-emitting dopant having a longer wavelength tends to be more luminous. Thus, in the present disclosure, the presence of red and blue light-emitting dopants in one light-emitting layer is avoided as much as possible, and the first light-emitting layer 4-1, which is a dual-color light-emitting layer that contains both green and blue dopants and emits green light and blue light, is used. Although green and blue light-emitting dopants are present in one light-emitting layer, emission of green light alone hardly occurs and it is easy to control the emission luminance ratio of the two colors, because the wavelengths of green light and blue light are close to each other.

The second light-emitting layer 4-2 in the present disclosure contains both red and green dopants. Although red and green light-emitting dopants are present in one light-emitting layer, emission of red light alone hardly occurs and it is easy to control the emission luminance ratio of the two colors, because the wavelengths of red light and green light are close to each other as in the case of green light and blue light. In addition, the presence of the green-light-emitting dopant in both the first light-emitting layer 4-1 and the second light-emitting layer 4-2 makes it easy to control the luminance of green and to achieve a balance of red, green, and blue light emissions.

(2) The first light-emitting layer 4-1 and the second light-emitting layer 4-2 each contain a host material and a light-emitting dopant material. The first light-emitting layer 4-1 and the second light-emitting layer 4-2 are in contact with each other, and the host material of the first light-emitting layer 4-1 is the same as the host material of the second light-emitting layer 4-2. The first light-emitting layer 4-1 contains, as the light-emitting dopant material, a green-light-emitting dopant material and a blue-light-emitting dopant material and is a dual-color light-emitting layer that emits green light and blue light. The second light-emitting layer 4-2 contains a red-light-emitting dopant material as the light-emitting dopant material and is a light-emitting layer that emits red light.

The first light-emitting layer 4-1 contains both green and blue dopants, but emission of green light alone hardly occurs and it is easy to control the emission luminance ratio of the two colors, as described above. The first light-emitting layer 4-1 and the second light-emitting layer 4-2 are in direct contact with each other, and the second light-emitting layer 4-2 is a red-light-emitting layer containing the same host material as that of the first light-emitting layer 4-1. This configuration facilitates the flow of electrons or holes from the red-light-emitting layer to the green and blue light-emitting layer to prevent an excessive red light emission, thus making it easy to achieve a balance of red, green, and blue light emissions.

(3) The anode 2 is a reflective electrode that reflects light, and the cathode 6 is a transmissive electrode that transmits light. At least the anode 2, the second light-emitting layer 4-2, the first light-emitting layer 4-1, and the cathode 6 are stacked in this order.

In the present disclosure, the reflective electrode (the anode 2) formed on the substrate 1, the red-light-emitting layer or the dual-color light-emitting layer (the second light-emitting layer 4-2) that emits red light and green light, the dual-color light-emitting layer (the first light-emitting layer 4-1) that emits blue light and green light, and the transmissive electrode (the cathode 6) may be stacked in this order. The element may be of top-emission type in which light is emitted from the side opposite the substrate 1. For an element of top-emission type, a substrate such as a silicon substrate can be used. Being reflective means having the property of reflecting 50% or more of light emitted from the element, and being transmissive means having the property of transmitting 50% or more of light emitted from the element. The red-light-emitting dopant has a narrow band gap and more easily traps electrons than the light-emitting dopants of the other colors, and thus disposing the second light-emitting layer 4-2 nearest to the anode 2 facilitates the supply of electrons to the green and blue light-emitting layer (the first light-emitting layer 4-1).

(4) The first light-emitting layer 4-1 satisfies relations (i) and (ii) below.

(i) LUMO (H)<LUMO (BD)
(ii) HOMO (H)<HOMO (BD)

Figure 2A:
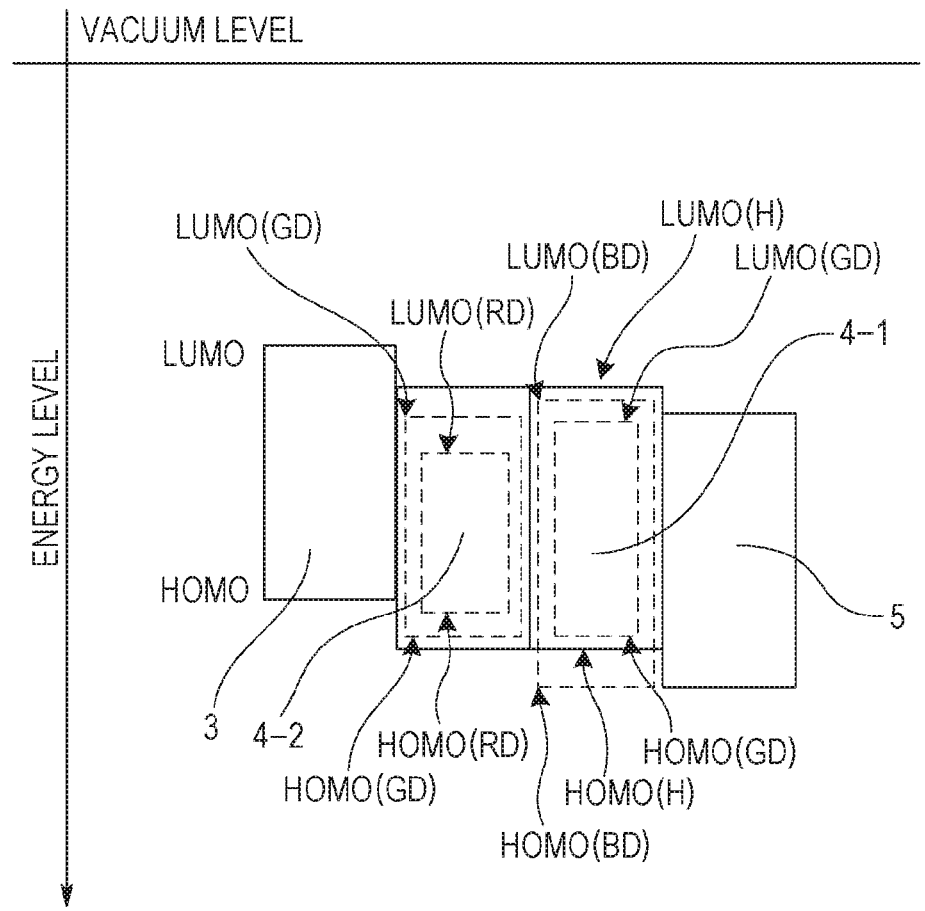
FIG. 2A is an energy diagram schematically illustrating energy levels of light-emitting layers and layers nearby constituting the white organic EL element according to this embodiment.

LUMO (H): absolute value of lowest unoccupied molecular orbital (LUMO) energy of host material LUMO (BD): absolute value of LUMO energy of blue-light-emitting dopant material HOMO (H): absolute value of highest occupied molecular orbital (HOMO) energy of host material HOMO (BD): absolute value of HOMO energy of blue-light-emitting dopant material The above (i) and (ii) will be described with reference to FIG. 2A. FIG. 2A is an energy diagram schematically illustrating energy levels of light-emitting layers and layers nearby constituting the organic EL element of the present disclosure. FIG. 2A is an example in which the host material and the green-light-emitting dopant material satisfy the relations (i) and (ii).

When the first light-emitting layer 4-1 satisfies both the relations (i) and (ii), the blue-light-emitting dopant material traps electrons but not holes, among electric charges. The first light-emitting layer 4-1 in the present disclosure contains both the green-light-emitting dopant and the blue-light-emitting dopant, and the green-light-emitting dopant having a longer wavelength tends to be more luminous as described above. If the blue-light-emitting dopant has electron-trapping properties to prevent this, electric charges are caused to recombine in the blue-light-emitting dopant, thus advantageously making it easy to control the luminance of blue and to achieve a balance of red, green, and blue light emissions.

Values of HOMO energy and LUMO energy are calculated with respect to the vacuum level and are negative in the case of typical molecules. However, in this specification, when values of HOMO energy and LUMO energy are compared by using a sign of inequality, absolute values are used. Large absolute values are expressed as "deep", and small absolute values as "shallow".

In the present disclosure, values of HOMO energy and LUMO energy are determined by molecular orbital calculation. The molecular orbital calculation was performed by the density functional theory (DFT), which is now widely used. The B3LYP functional and the 6-31G* basis function were used. The molecular orbital calculation was performed by Gaussian 09 (Gaussian 09, Revision C.01, M. J. Frisch, G. W. Trucks, H. B. Schlegel, G. E. Scuseria, M. A. Robb, J. R. Cheeseman, G. Scalmani, V. Barone, B. Mennucci, G. A. Petersson, H. Nakatsuji, M. Caricato, X. Li, H. P. Hratchian, A. F. Izmaylov, J. Bloino, G. Zheng, J. L. Sonnenberg, M. Hada, M. Ehara, K. Toyota, R. Fukuda, J. Hasegawa, M. Ishida, T. Nakajima, Y. Honda, O. Kitao, H. Nakai, T. Vreven, J. A. Montgomery Jr., J. E. Peralta, F. Ogliaro, M. Bearpark, J. J. Heyd, E. Brothers, K. N. Kudin, V. N. Staroverov, T. Keith, R. Kobayashi, J. Normand, K. Raghavachari, A. Rendell, J. C. Burant, S. S. Iyengar, J. Tomasi, M. Cossi, N. Rega, J. M. Millam, M. Klene, J. E. Knox, J. B. Cross, V. Bakken, C. Adamo, J. Jaramillo, R. Gomperts, R. E. Stratmann, O. Yazyev, A. J. Austin, R. Cammi, C. Pomelli, J. W. Ochterski, R. L. Martin, K. Morokuma, V. G. Zakrzewski, G. A. Voth, P. Salvador, J. J. Dannenberg, S. Dapprich, A. D. Daniels, O. Farkas, J. B. Foresman, J. V. Ortiz, J. Cioslowski, and D. J. Fox, Gaussian, Inc., Wallingford Conn., 2010), which is now widely used.

In EXAMPLES described below, calculated values obtained by the molecular orbital calculation are compared with measured values to verify the accuracy of the calculated values.

(5) The first light-emitting layer 4-1 and the second light-emitting layer 4-2 are adjacent to each other, and the host material of the first light-emitting layer 4-1 is the same as the host material of the second light-emitting layer 4-2.

In the white organic EL element according to the first embodiment, as with the white organic EL element according to the second embodiment, two light-emitting layers, that is, the first light-emitting layer 4-1 and the second light-emitting layer 4-2, may be formed of the same host material in an adjacent manner, without another layer, such as an electron barrier layer, interposed therebetween. Being formed of the same host material in an adjacent manner is a feature to achieve a drive voltage of the element, specifically, to eliminate electrical resistance of such an electron barrier layer and to prevent an increase in voltage that may be caused by a transfer of electric charges (holes and electrons) in the light-emitting layers to a level of the other layer. In the present disclosure, the host material is a material contained in an amount of 50 mass % or more in a light-emitting layer as described above, and to decrease the voltage, the concentration of the host material may be high, preferably 90 mass % or more, more preferably 95 mass % or more.

(6) In the white organic EL element according to the first embodiment, relations (iii) and (iv) below are satisfied.

(iii) LUMO (H)<LUMO (RD)
(iv) LUMO (H)<LUMO (GD)

LUMO (H): absolute value of LUMO energy of host material

LUMO (RD): absolute value of LUMO energy of red-light-emitting dopant material

LUMO (GD): absolute value of LUMO energy of green-light-emitting dopant material The above (iii) and (iv) will be described with reference to FIG. 2A. FIG. 2A is an example in which the host material, the red-light-emitting dopant material, and the green-light-emitting dopant material satisfy the relations (iii) and (iv).

When the second light-emitting layer 4-2 satisfies both the relations (iii) and (iv), the red-light-emitting dopant material and the green-light-emitting dopant material have deeper LUMO levels than the host material. This causes the light-emitting dopant materials to trap electrons as described in (4). This enables the host material to deliver electrons or excitation energy to both the red-light-emitting dopant material and the green-light-emitting dopant material. This advantageously enables both the two light-emitting dopants to emit light.

(7) In the white organic EL element according to the first embodiment, the green-light-emitting dopant material is present in the second light-emitting layer 4-2 at a concentration of 1 mass % or more and less than 5 mass %.

In the present disclosure, the second light-emitting layer 4-2 is able to emit light of two colors: red and green, as described above, but red light emission tends to be stronger than green light emission. Thus, the amount of the green-light-emitting dopant material in the second light-emitting layer 4-2 is preferably 0.1 mass % or more, more preferably 1 mass % or more. Less than 0.1 mass % of the green-light-emitting dopant material may result in low green luminance. The amount of the green-light-emitting dopant material in the second light-emitting layer 4-2 is preferably less than 10 mass %, more preferably less than 5 mass %. More than 10 mass % of the green-light-emitting dopant material may excessively increase the electron-trapping properties, thus resulting in a high voltage across the element. In addition, since the voltage across the element tends to be low when the concentration of the host material is 90 mass % or more, more preferably 95 mass % or more, as described in (5), the amount of the light-emitting dopant material is preferably less than 10 mass %, more preferably less than 5 mass %.

(8) The light-emitting dopant material has a fused ring including a five-membered ring.

In the present disclosure, the material used as the light-emitting dopant material is not particularly limited but may have a deeper LUMO level than the host material as described in (4) and (6). Such a material may have a fused ring including a five-membered ring, such as a fluoranthene skeleton which is an electron-withdrawing structure. This increases the difference in LUMO energy between the material and the host material, thus improving electron-trapping properties. The material preferably does not have an electron-donating substituted amino group. This is because a material having a substituted amino group has a shallow LUMO energy and low electron-trapping properties. Also in terms of binding stability, a compound that does not have a substituted amino group that forms a nitrogen-carbon single bond may be used. Thus, when the dopant material is a compound that has a fused ring including a five-membered ring and has no substituted amino groups, a light-emitting layer having high electron-trapping properties can be formed. In addition, the material itself forming the light-emitting layer has high stability, and thus an element having high durability can be provided.

The above-described fused ring including a five-membered ring will now be described. The fused ring including a five-membered ring refers to a fluoranthene ring or a fused polycyclic structure formed of a fluoranthene ring and an aromatic hydrocarbon fused together. Specific examples include fused polycyclic structures FF1 to FF30 below. Of these, to improve electron-withdrawing properties and improve electron-trapping properties, the dopant may have a structure containing two or more fluoranthene rings (the fluoranthene rings may share some aromatic rings), preferably a structure containing two or more fluoranthene rings fused together. Specifically, dopant materials having skeletons FF7 to FF13, FF16 to FF20, and FF23 to FF30 are suitable for use in the present disclosure.

FF1

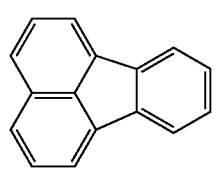

FF2

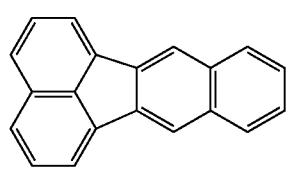

-continued

FF3

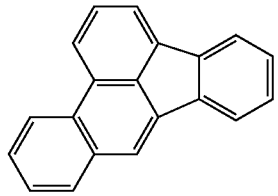

FF4

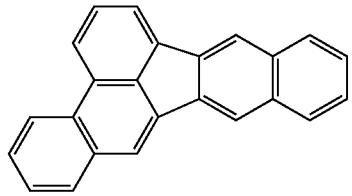

FF5

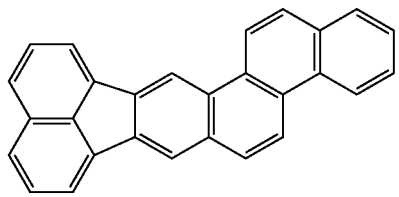

FF6

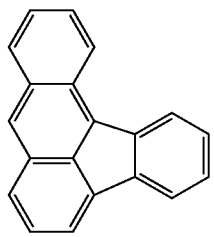

FF7

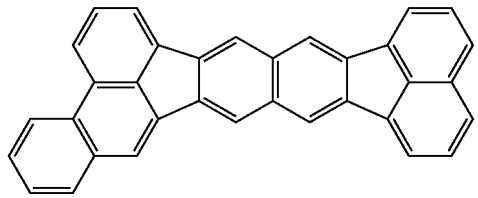

FF8

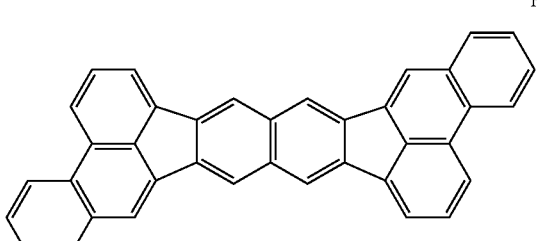

FF9

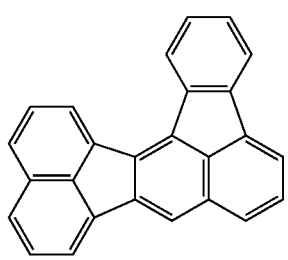

FF10
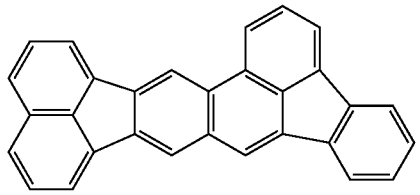
FF11
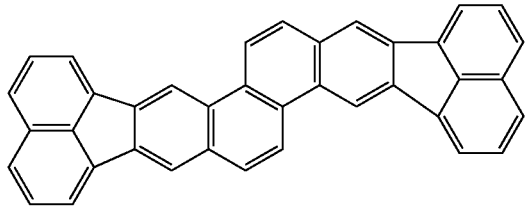
FF12
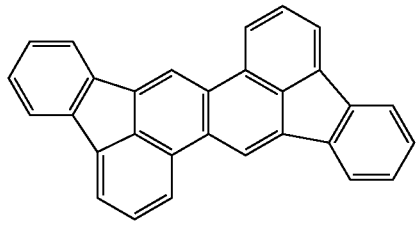
FF13
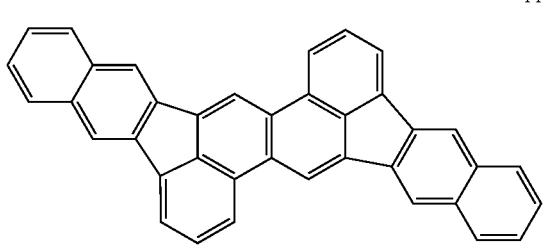
FF14
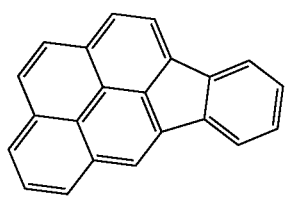
FF15
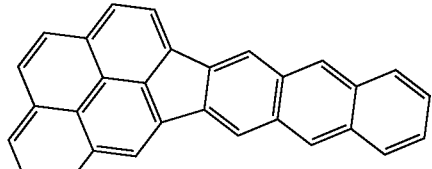
FF16
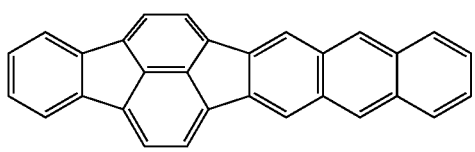
FF17
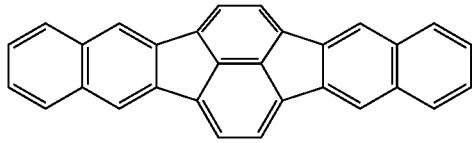
FF18
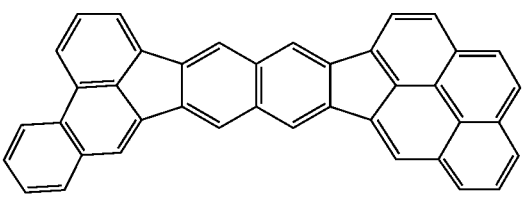
FF19
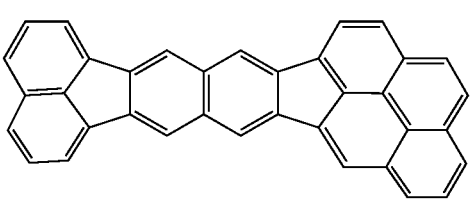
FF20
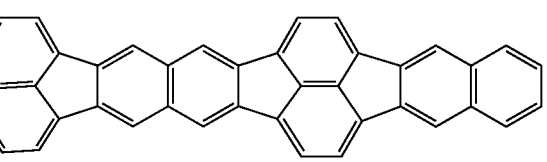
FF21
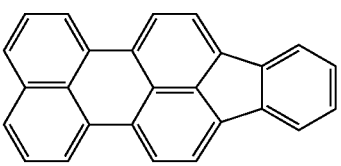
FF22
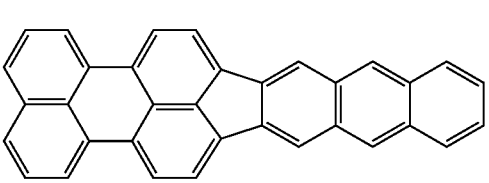
FF23
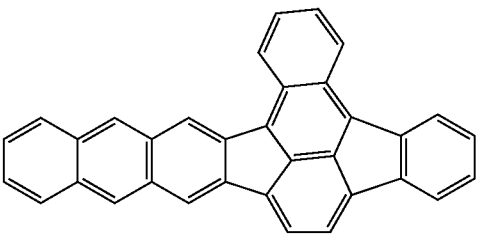
FF24
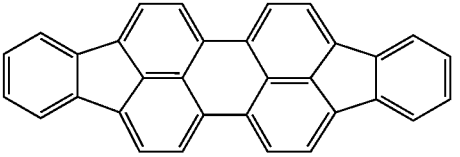
FF25
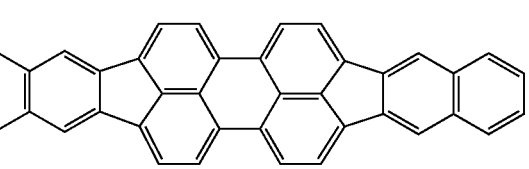

-continued

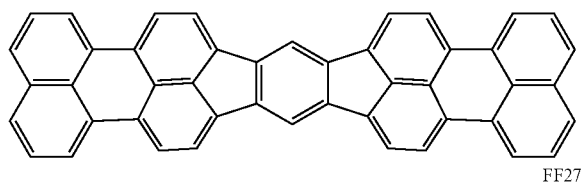
FF26

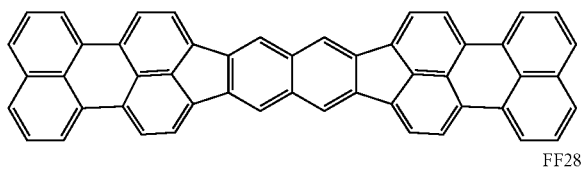
FF27

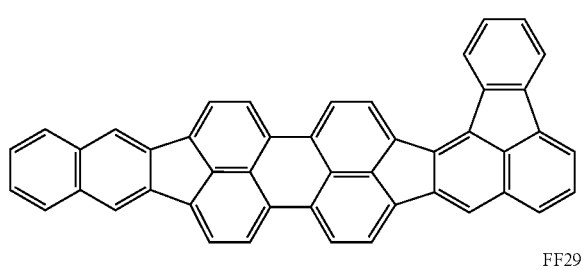
FF28

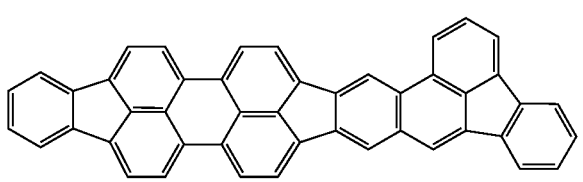
FF29

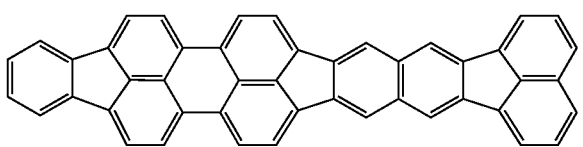
FF30

(9) The host material consists of a hydrocarbon.

In the present disclosure, the material used as the host material is not particularly limited, and a compound not having, in its molecular structure, a bond with low binding stability may be used. This is because if a compound having, in its molecular structure, a bond with low binding stability, that is, an unstable bond such as an amino group with a low binding energy, is used as the host material of the light-emitting layer, the compound is likely to deteriorate during element operation and may adversely affect the operating life of the element.

In particular, in the present disclosure, when a common host material having a wide band gap is used in order to allow the blue-light-emitting dopant material to emit light, the exciton energy generated during electric charge recombination may be high. Thus, if the host material is a material having a bond with low binding energy, such as an amino group, deterioration may occur during operation.

Figure 2B:
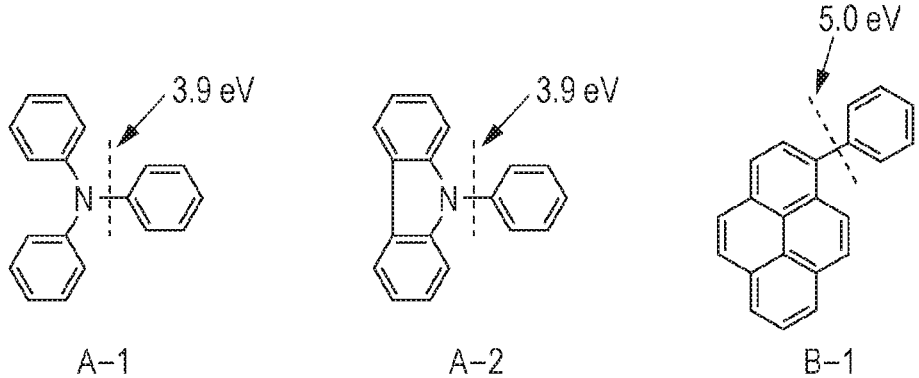
FIG. 2B is chemical structures of A-1, A-2 and B-1 and binding energies thereof.

FIG. 2B is chemical structures of A-1, A-2 and B-1 and binding energies thereof. For example, referring to compounds A-1, A-2, and B-1 shown in FIG. 2B, the bond linking a carbazole ring with a phenyl group and the bond linking an amino group with a phenyl group (nitrogen-carbon bond) are bonds with low binding stability. The bond linking carbon with carbon as shown in compound B-1 has higher binding stability. The calculation was performed using b3-lyp/def2-SV(P).

The above results show that the host material of the organic EL element of the present disclosure may consist of a hydrocarbon.

(10) The molecular structure of the host material includes an aromatic hydrocarbon ring selected from the group consisting of a benzene ring, a naphthalene ring, a fluorene ring, a benzofluorene ring, a phenanthrene ring, a chrysene ring, a triphenylene ring, a pyrene ring, a fluoranthene ring, and a benzofluoranthene ring.

The host material may be an aromatic hydrocarbon compound having a molecular structure including an aromatic hydrocarbon ring selected from the group consisting of a benzene ring, a naphthalene ring, a fluorene ring, a benzofluorene ring, a phenanthrene ring, a chrysene ring, a triphenylene ring, a pyrene ring, a fluoranthene ring, and a benzofluoranthene ring. As described in (9), in the present disclosure, when a common host material having a wide band gap that allows the blue-light-emitting dopant material to emit light is used, the exciton energy generated during electric charge recombination is high, and thus a structure having a high binding energy may be used. Therefore, a molecular structure may be used that includes an aromatic hydrocarbon ring in which the number of linearly fused benzene rings is up to two, the aromatic hydrocarbon ring being selected from the group consisting of a benzene ring, a naphthalene ring, a fluorene ring, a benzofluorene ring, a phenanthrene ring, a chrysene ring, a triphenylene ring, a pyrene ring, a fluoranthene ring, and a benzofluoranthene ring. A structure in which three or more benzene rings are linearly fused, such as an anthracene ring, is preferably not contained.

As compared to a structure in which three or more benzene rings are linearly fused, such as an anthracene ring, a structure in which the number of linearly fused benzene rings is up to two is resistant to bond dissociation that may be caused by the exciton energy generated during electric charge recombination. Table 1 shows calculated values of the bond order and the dihedral angle at linkages between a phenyl group and a pyrene ring, a fluoranthene ring, a phenanthrene ring, and an anthracene ring. It can be seen that the anthracene ring has a large dihedral angle and a low bond order. That is, a structure in which three or more benzene rings are linearly fused causes a large steric repulsion and accordingly has a low bond order.

TABLE 1

| Structure | Bond order | Dihedral angle |
|---|---|---|
| 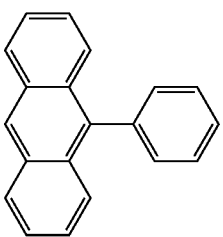 [SMILES: c1ccc(-c2c3ccccc3cc3ccccc23)cc1] | 0.995 | 90.0 |

TABLE 1-continued

| Structure | Bond order | Dihedral angle |
|---|---|---|
| | 1.029 | 56.0 |
| | 1.023 | 58.6 |
| | 1.014 | 62.8 |
| | 1.037 | 51.2 |
| | 1.019 | 59.1 |

The molecular structures were analyzed by the density functional theory (DFT). The dihedral angles were determined by calculation using the B3LYP functional and the 6-31G* basis function. The bond orders were subjected to natural bonding orbital (NBO) analysis, and Wiberg bond indices were used.

As illustrated below, in the case of an anthracene skeleton, hydrogen at the 1-position of an anthracene ring and hydrogen at the 12-position of a phenyl group repel each other, and hydrogen at the 8-position and hydrogen at the 11-position repel each other. By contrast, in the case of a pyrene ring, for example, hydrogen at the 10-position of the pyrene ring and hydrogen at the 11-position of a phenyl group repel each other in a similar manner, but the repulsion between hydrogen at the 2-position and hydrogen at the 12-position is weak. In the case of an anthracene ring substituted at the 2-position and unsubstituted at the 9-position and the 10-position, the anthracene ring has substitution positions with a high electron density in the central benzene ring. Thus, the anthracene ring is prone to oxidation and is an aromatic hydrocarbon with low chemical stability. Hence, as compared to a structure in which three or more benzene rings are linearly fused, such as an anthracene ring, a structure in which the number of linearly fused benzene rings is up to two has a high bond order, is resistant to bond dissociation that may be caused by the exciton energy generated during electric charge recombination, and has a high binding energy.

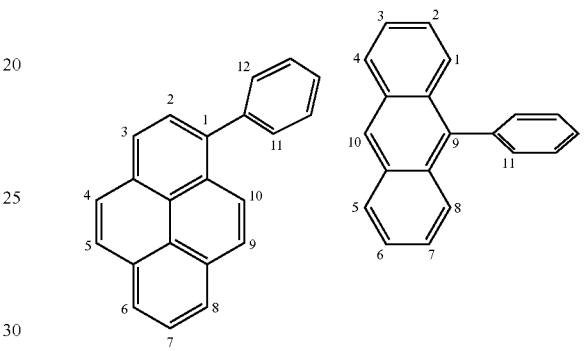

As described above, the host material may be an aromatic hydrocarbon compound having a molecular structure including a structure, such as a benzene ring, a naphthalene ring, a fluorene ring, a benzofluorene ring, a phenanthrene ring, a chrysene ring, a triphenylene ring, a pyrene ring, a fluoranthene ring, and a benzofluoranthene ring, in which the number of linearly fused benzene rings is up to two. Such a material is resistant to bond dissociation that may be caused by the exciton energy generated during electric charge recombination and thus provides a highly durable element. This effect is greater in the first light-emitting layer, which is a layer that emits blue light and green light, because the excitation energy is higher.

The above-described host material may be substituted with an alkyl group having 1 to 12 carbon atoms. Specific examples of such alkyl groups include methyl, ethyl, n-propyl, iso-propyl, n-butyl, iso-butyl, sec-butyl, tert-butyl, n-pentyl, iso-pentyl, neo-pentyl, tert-pentyl, hexyl, heptyl, and octyl.

(11) The white organic EL element includes a hole blocking layer that is adjacent to the light-emitting layer on the cathode side, and the hole blocking layer consists of a hydrocarbon.

In the present disclosure, a layer that is adjacent to the light-emitting layer on the cathode 6 side serves to block holes in the light-emitting layer, and thus holes are accumulated at or near the interface between the layer and the light-emitting layer. That is, a molecular structure resistant to excessively generated radical cations is required, and the layer that is adjacent to the light-emitting layer on the cathode 6 side may be a hole blocking layer that consists of a hydrocarbon having high chemical stability. In general, compounds having a heteroatom such as a nitrogen atom, an oxygen atom, or a sulfur atom have an unshared electron pair and thus are active against donation and acceptance of electrons, that is, oxidation and reduction. Thus, such a compound has low chemical stability because unpaired electrons generated through donation and acceptance of electrons may cause an interaction, such as a disproportionation, that can lead to material deterioration. By contrast, hydrocarbons advantageously have no unshared electron pairs and have high chemical stability.

(12) The white organic EL element includes an electron blocking layer that is adjacent to the light-emitting layer on the anode side, and the electron blocking layer is made of a material having a carbazole skeleton.

A material having a carbazole skeleton may be used for the electron blocking layer. A material having a carbazole skeleton such as a carbazole group has a deeper HOMO level than a hole transporting material having a structure without a carbazole skeleton. This can advantageously create an energy level in which the HOMO level becomes gradually deeper in the order of the hole transporting material, the hole blocking material, and the light-emitting layer, thus enabling holes to be injected into the light-emitting layer at a low voltage.

(13) The white organic EL element includes the electron transport layer 5 that is adjacent to the hole blocking layer on the cathode 6 side, and the electron transport layer 5 is made of a material having a pyridyl group or a phenanthrolyl group.

A material having a pyridyl group or a phenanthrolyl group as a substituent may be used for the electron transport layer. This is because such a material interacts with electron injecting materials, such as alkali metal compounds, and electrode materials to help reduce the electron injection barrier.

Specific examples of light-emitting layer materials used in the present disclosure are shown below. These are materials suitable for satisfying the energy level relations (4) and (6) described above. It is to be noted that these compounds are given by way of illustration and not by way of limitation.

EM1 to EM31 are specific examples of host materials.

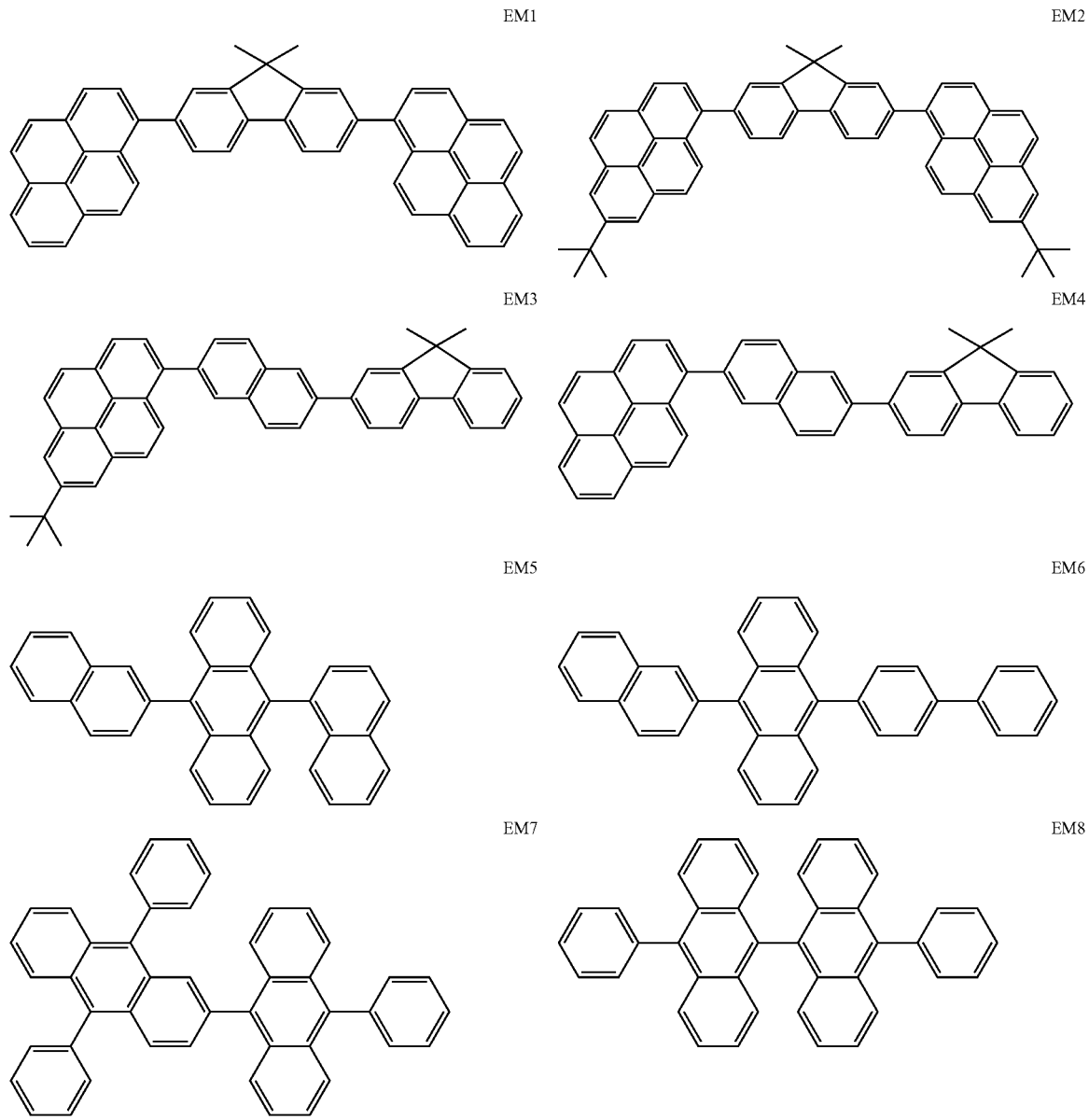

-continued
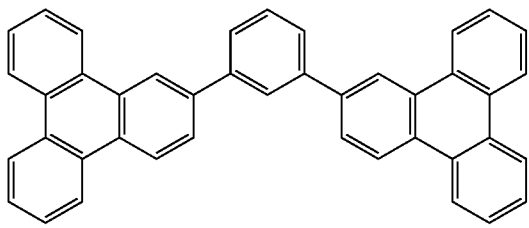

-continued
EM19
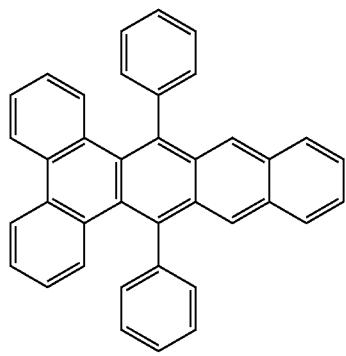
EM20
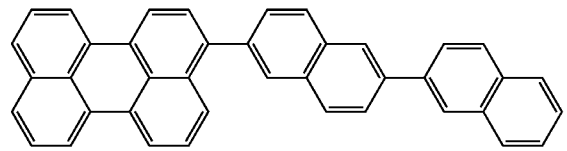
EM21
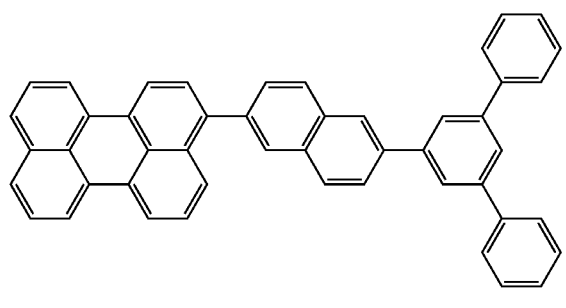
EM22
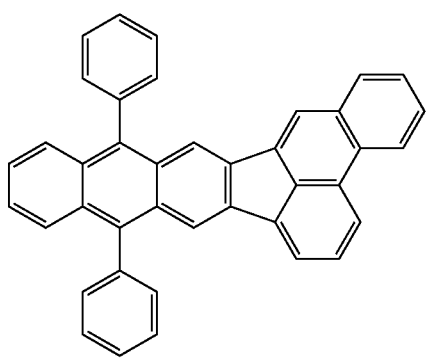
EM23
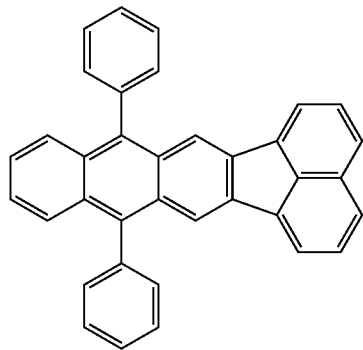
EM24
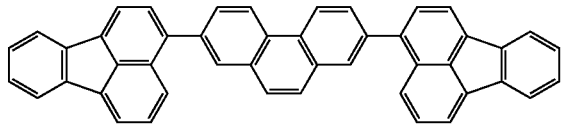
EM25
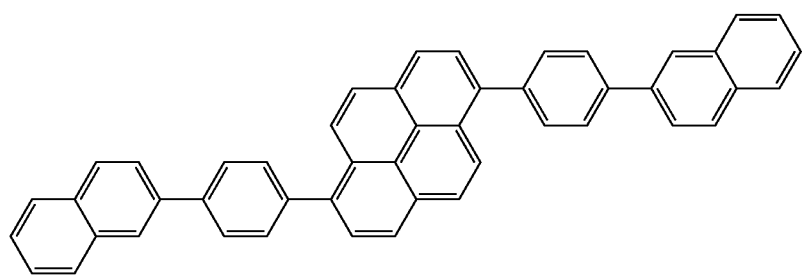
EM26
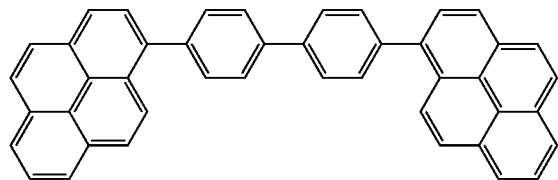
EM27
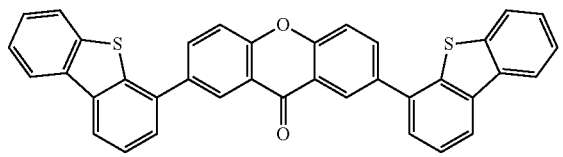

EM28
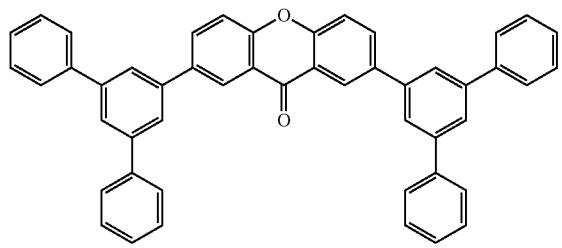
EM29
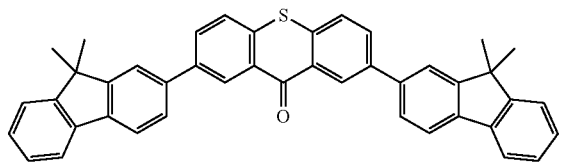
EM30
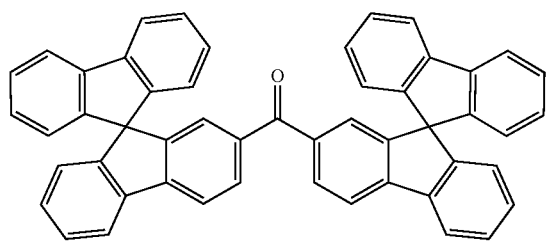
EM31
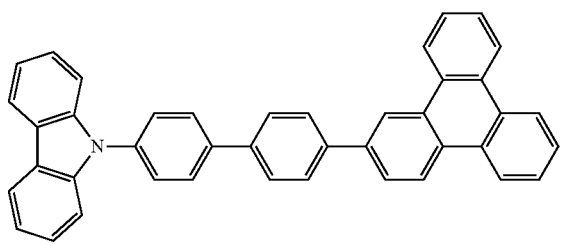
RD1 to RD23 are specific examples of red-light-emitting dopant materials.
RD1
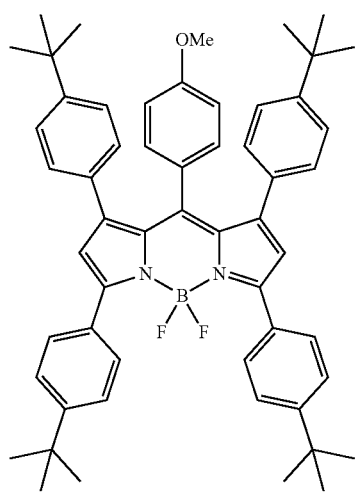
RD2
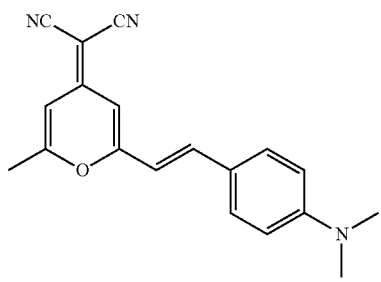
RD3
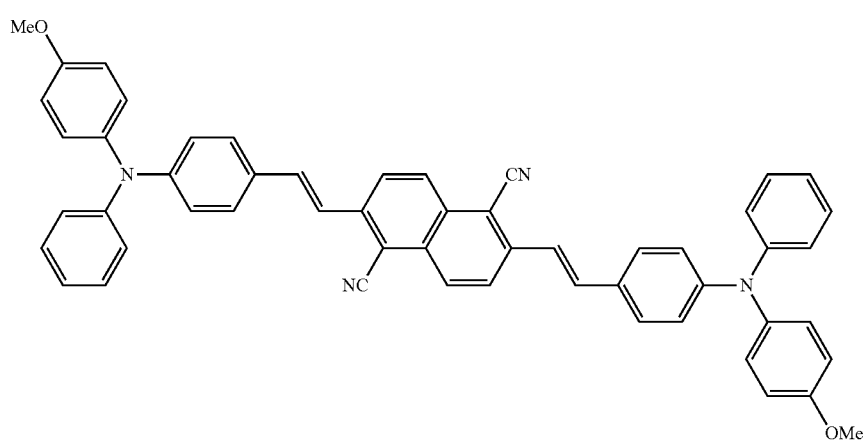

-continued
RD4
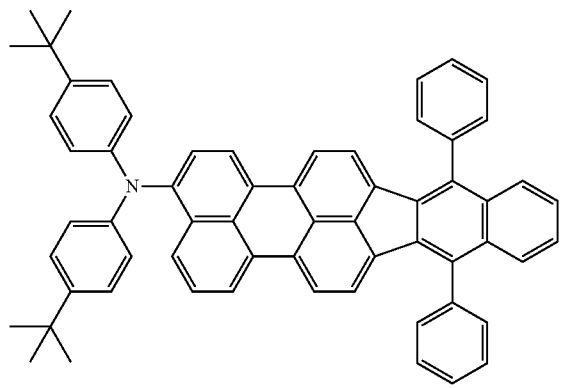
RD5
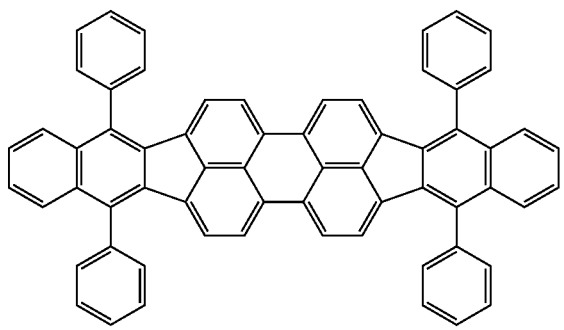
RD6
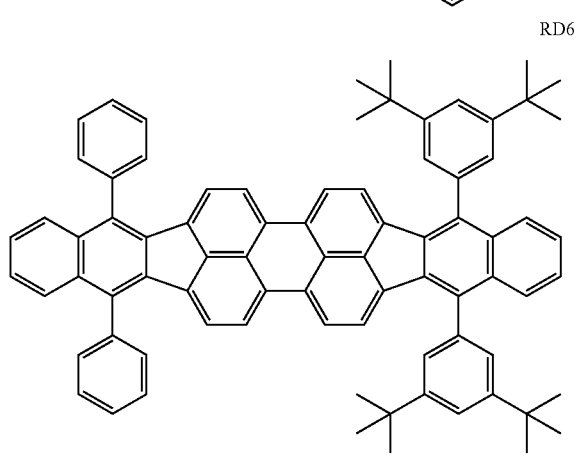
RD7
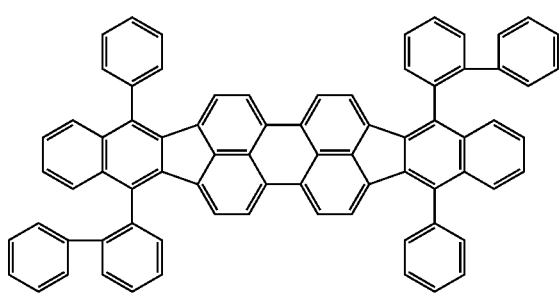
RD8
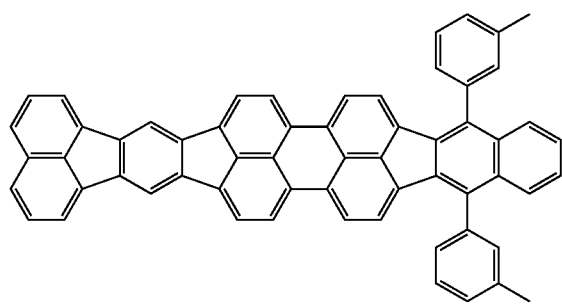
RD9
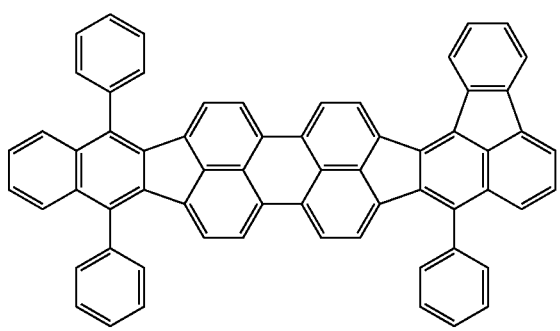
RD10
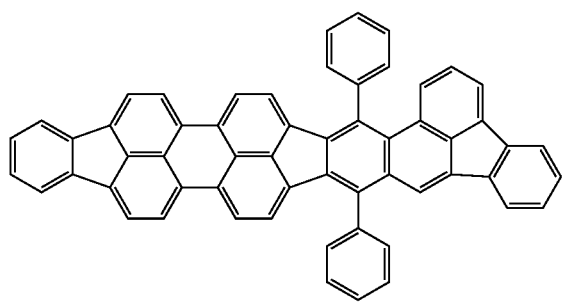
RD11
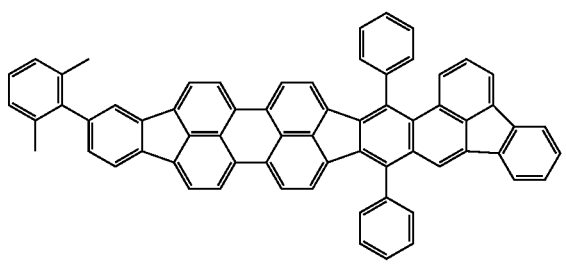

-continued
RD12
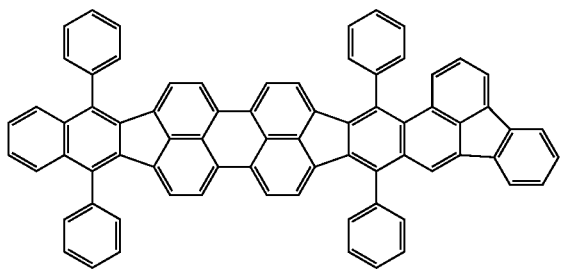
RD13
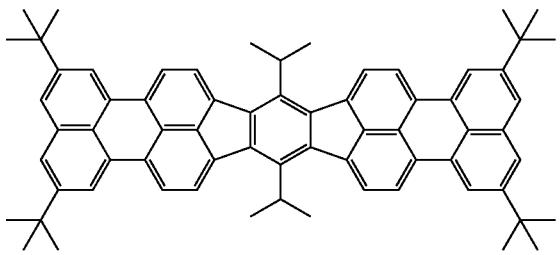
RD14
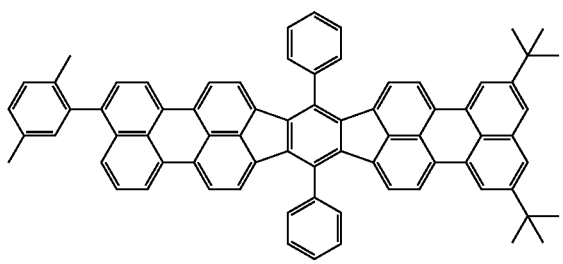
RD15
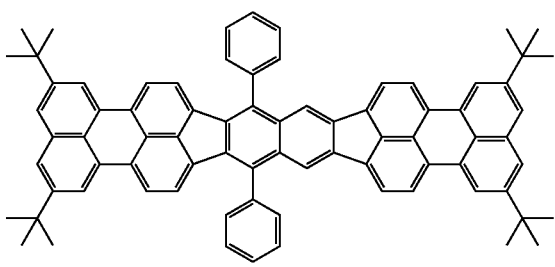
RD16
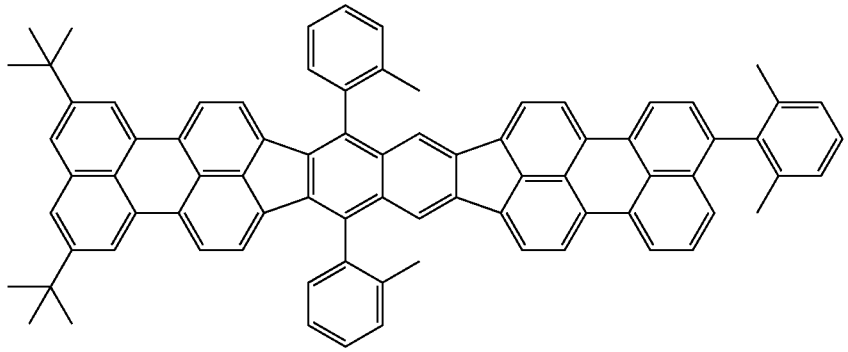
RD17
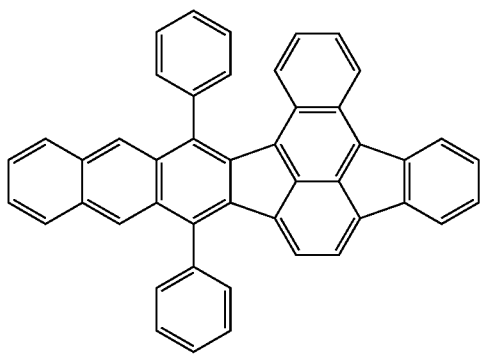
RD18
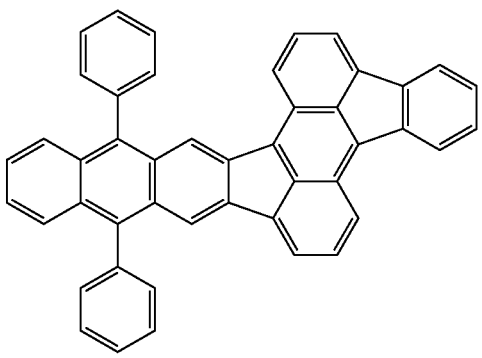
RD19
RD20
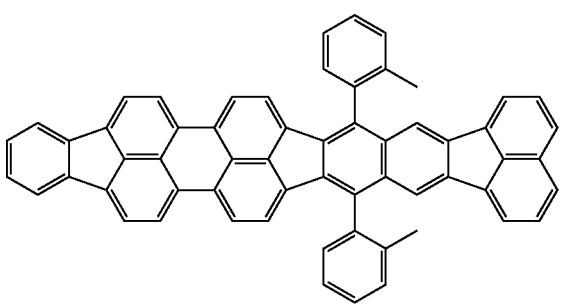

-continued

RD21
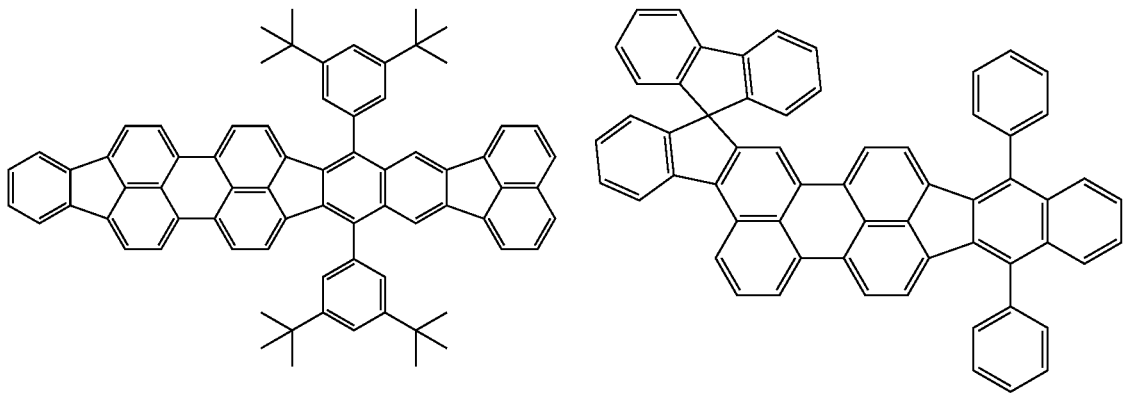
RD22

RD23
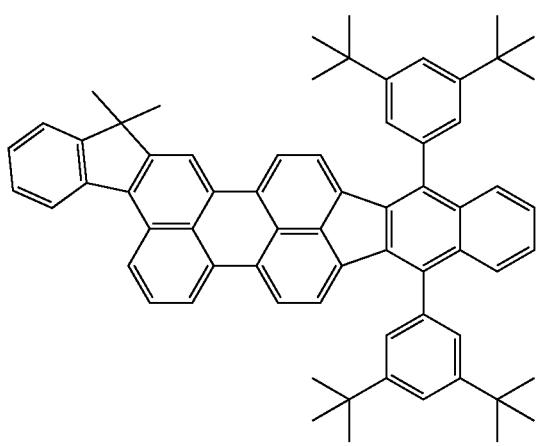

The doping concentration of the red-light-emitting dopant material is preferably 0.1 mass % or more and less than 5 mass %, more preferably 0.1 mass % or more and less than 0.5 mass %. An excessively low concentration may lead to a low red-light emission intensity. By contrast, an excessively high concentration may cause concentration quenching.

GD1 to GD32 are specific examples of green-light-emitting dopant materials.

-continued

GD2
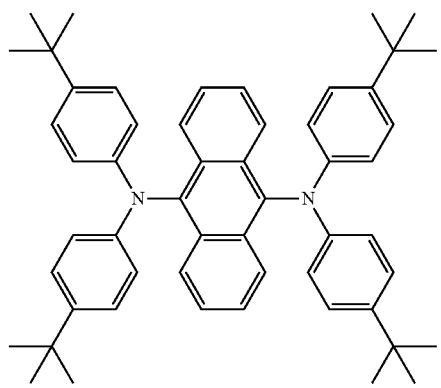

GD1
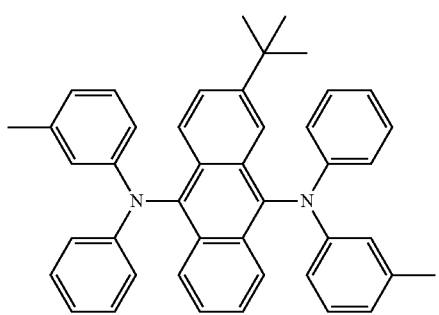

GD3
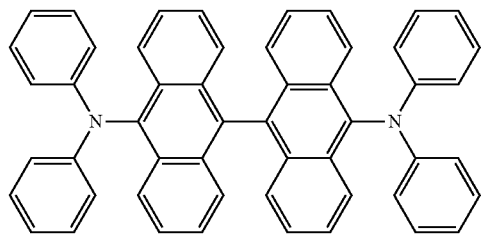

GD4
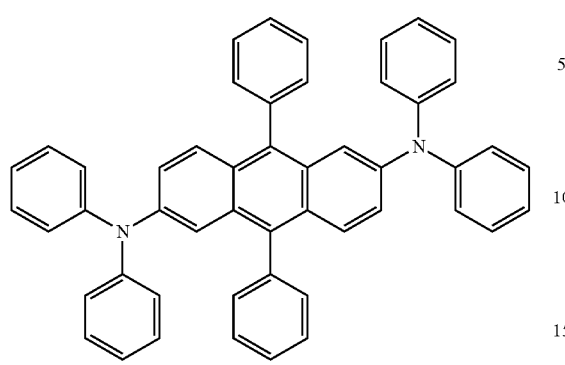
GD5
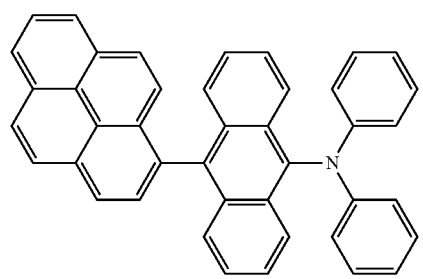
GD6
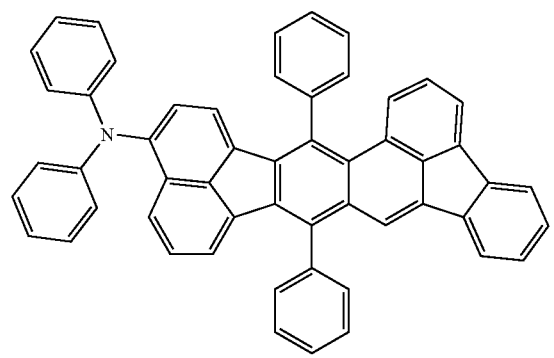
GD7
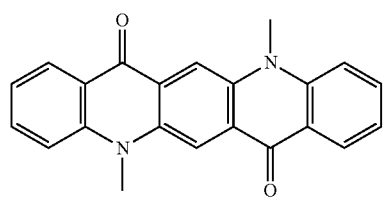
GD8
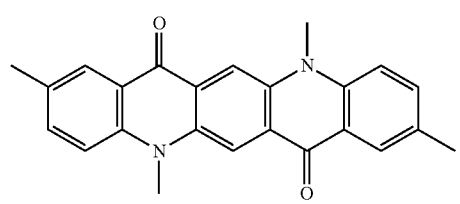
GD9
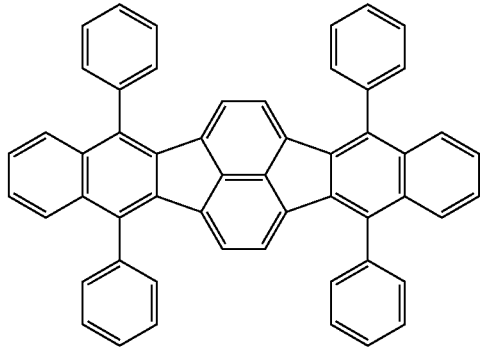
GD10
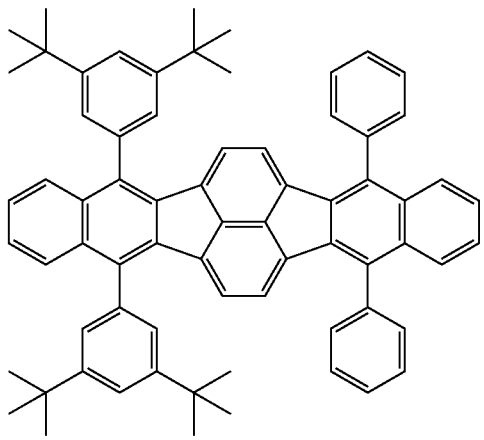
GD11
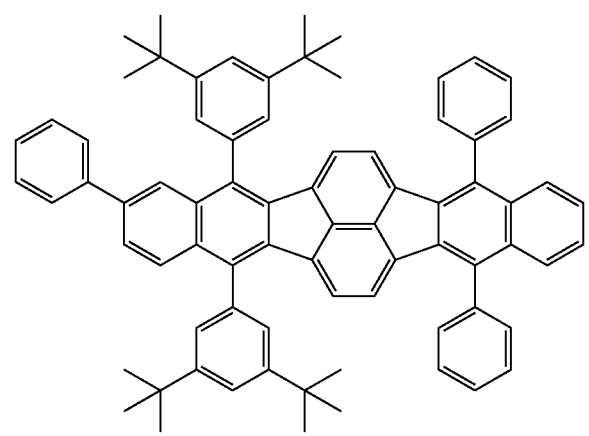

-continued
GD12
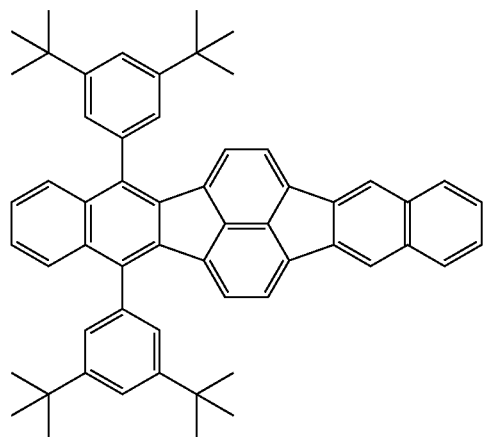
GD13
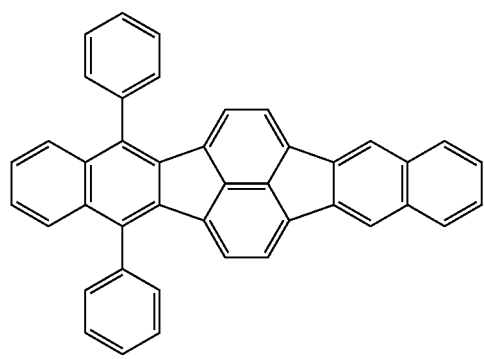
GD14
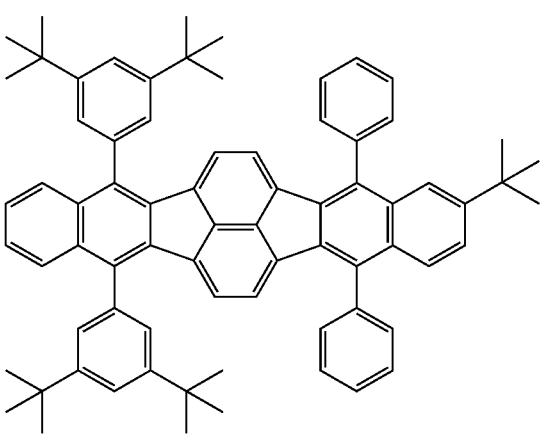
GD15
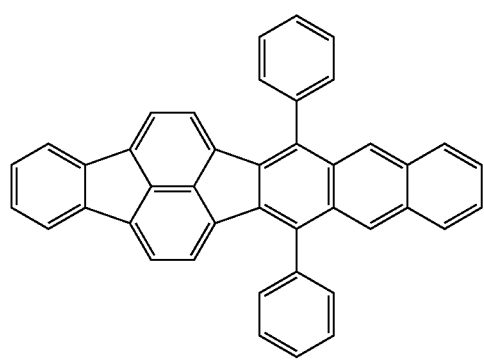
-continued
GD16
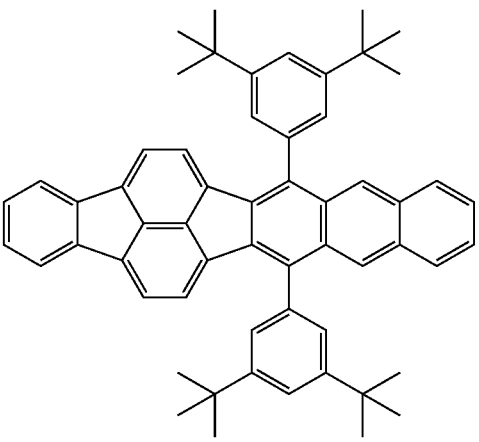
GD17
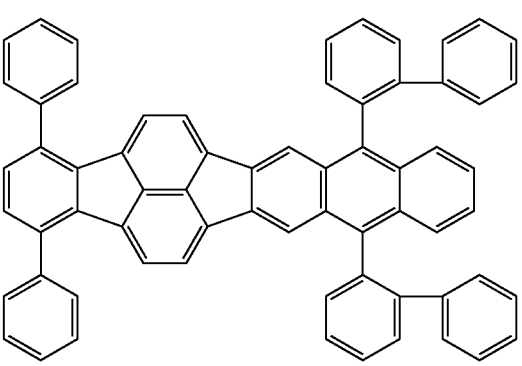
GD18
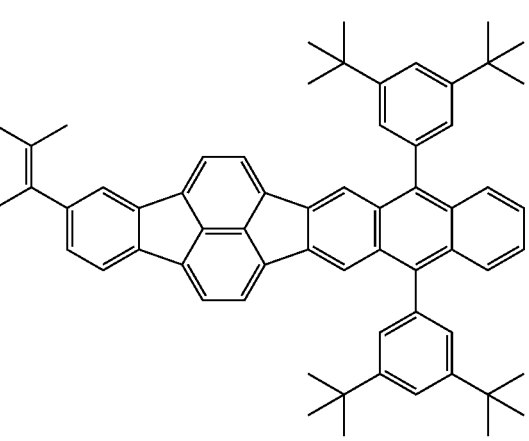
GD19
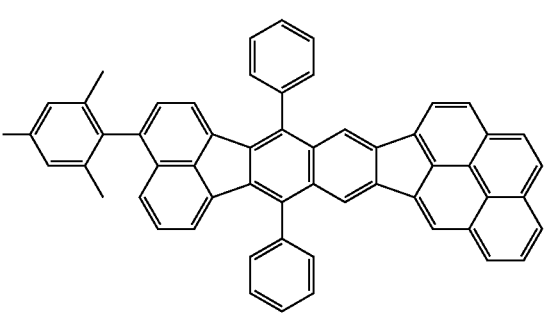

GD20
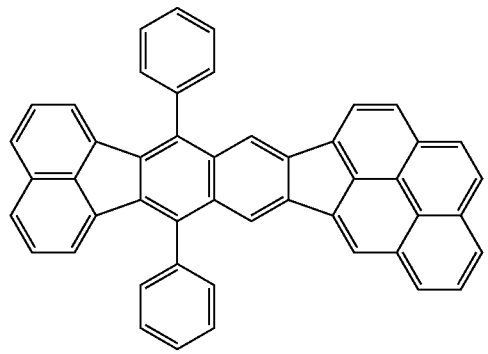
GD24
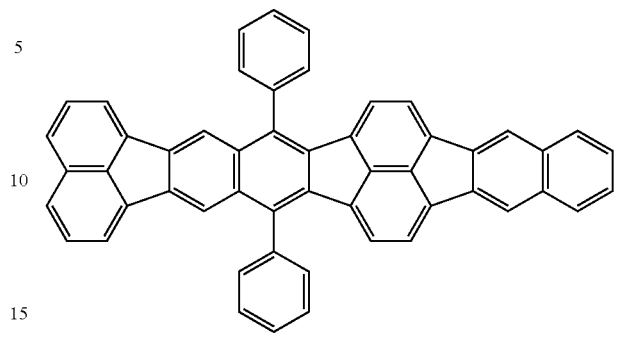
GD21
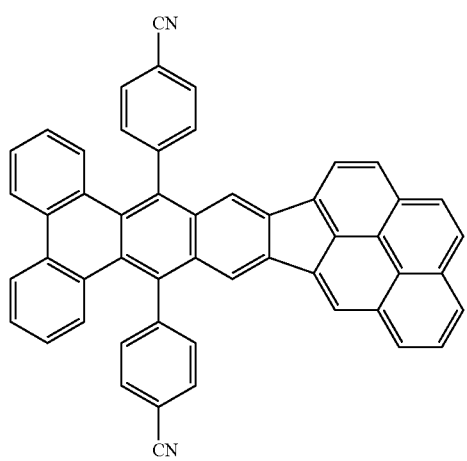
GD25
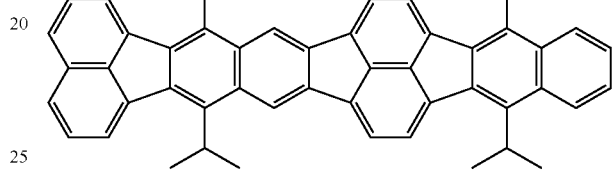
GD22
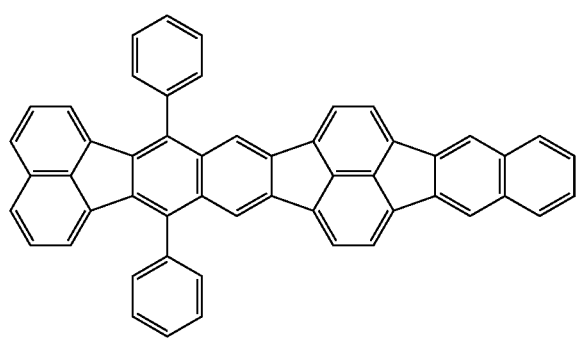
GD26
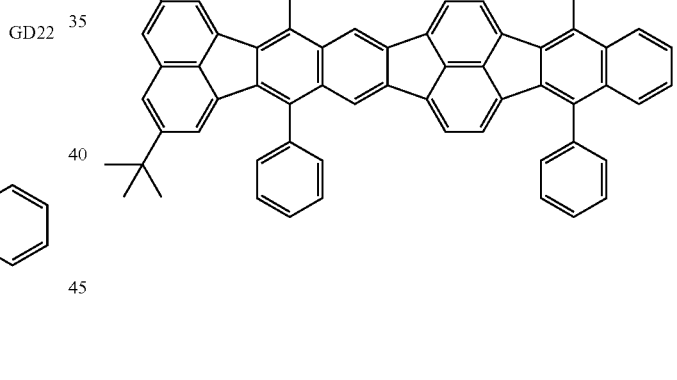
GD23
GD27
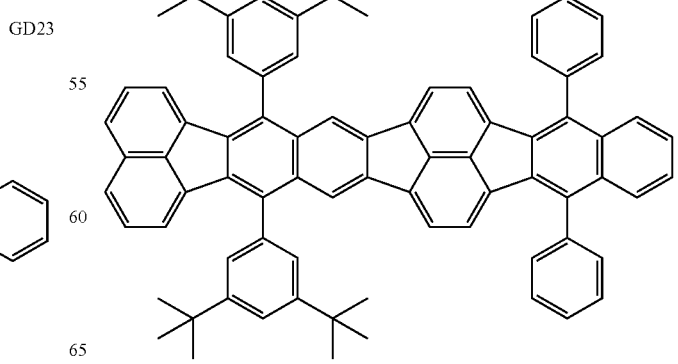

GD28
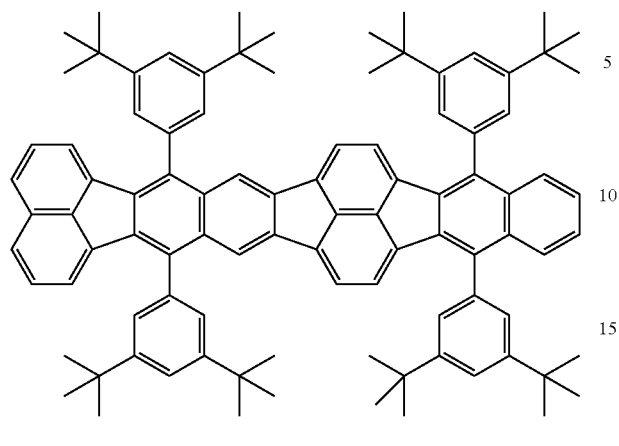

GD29
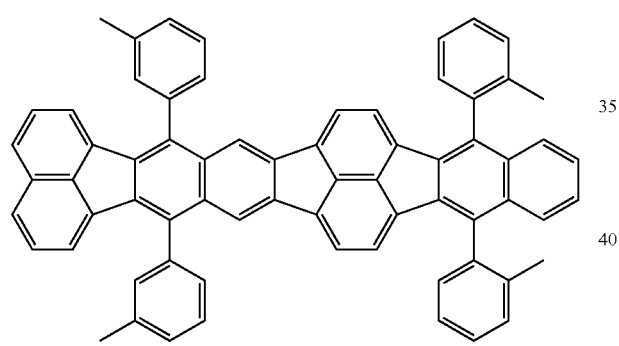

GD30
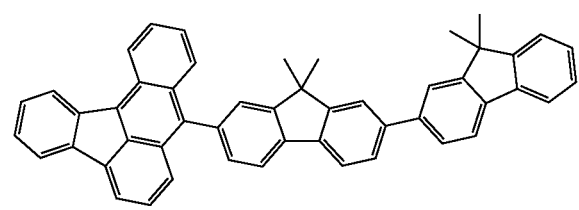

GD31
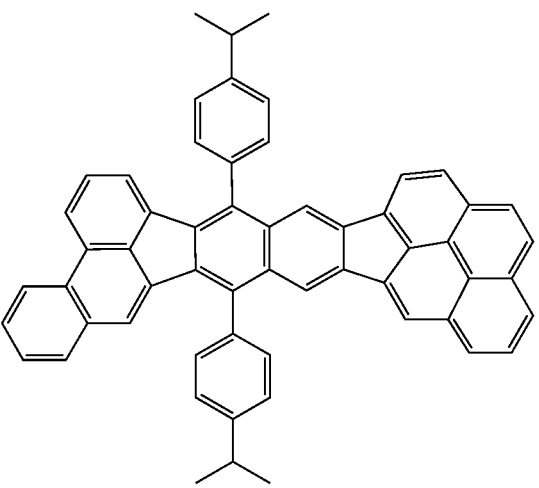

GD32
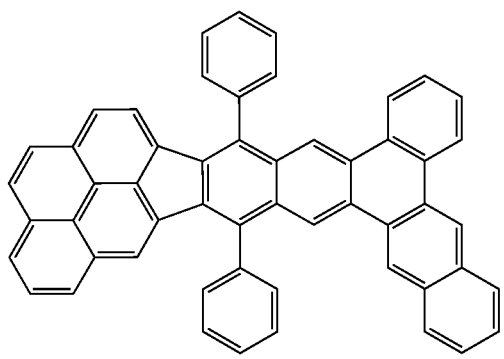

The green-light-emitting dopant material is used in combination with the blue-light-emitting dopant material in the first light-emitting layer 4-1. In the white organic EL element according to the first embodiment, the green-light-emitting dopant material is contained in combination with the red-light-emitting dopant material in the second light-emitting layer 4-2. The doping concentration of the green-light-emitting dopant material used in the first light-emitting layer 4-1 is preferably 0.1 mass % or more and less than 5 mass %, more preferably 0.1 mass % or more and less than 1%. The doping concentration of the green-light-emitting dopant material used in the second light-emitting layer 4-2 is preferably 0.1 mass % or more and less than 10 mass %, more preferably 1 mass % or more and less than 5 mass %, as described above in (7).

BD1 to BD31 are specific examples of blue-light-emitting dopant materials.

BD1
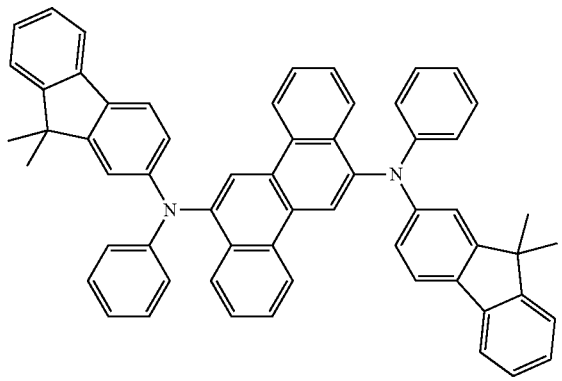
BD2
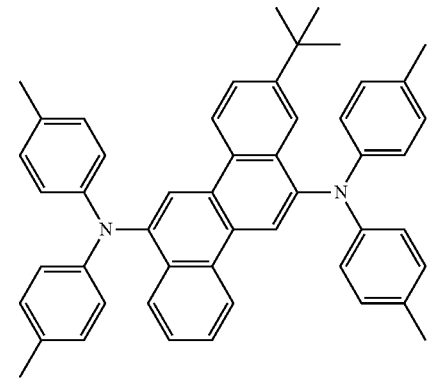
BD3
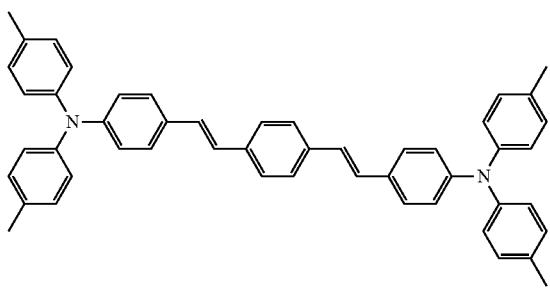
BD4
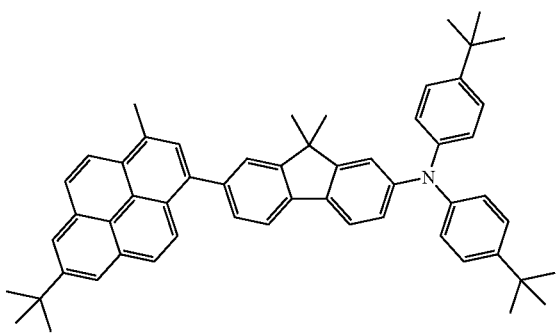
BD5
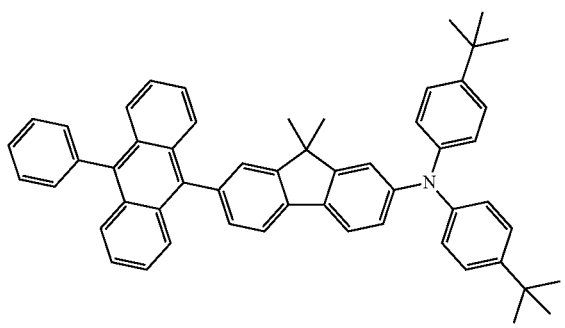
BD6
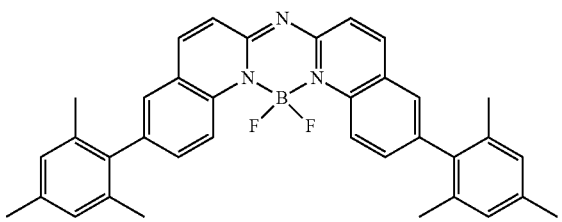
BD7
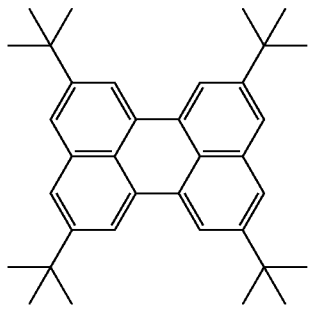
BD8
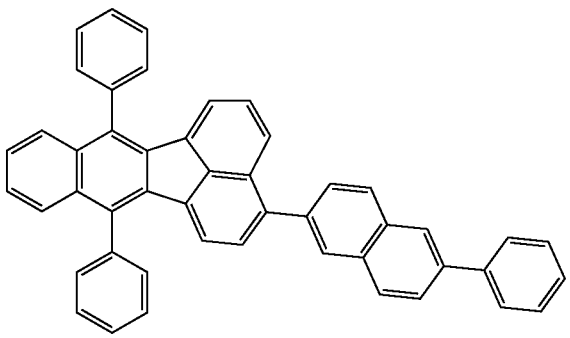

BD9
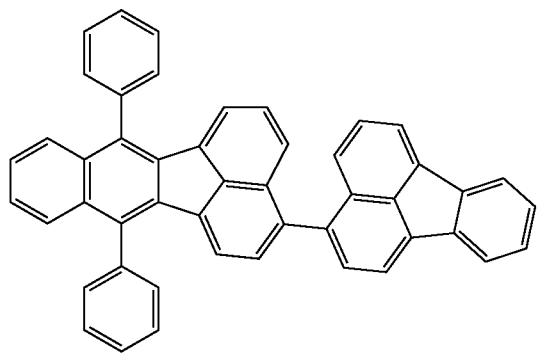
BD10
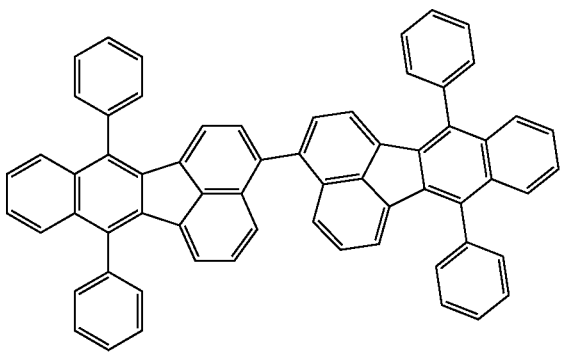
BD11
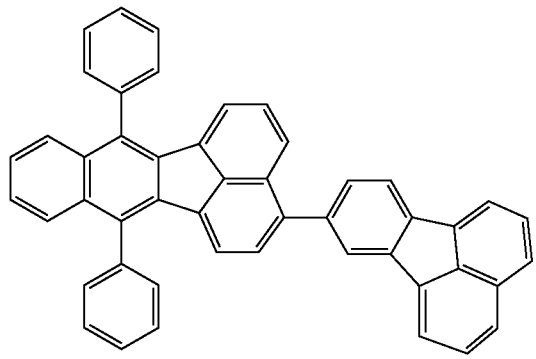
BD12
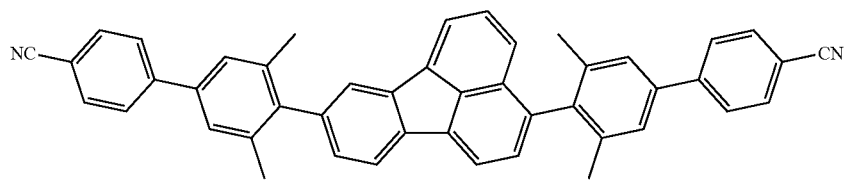
BD13
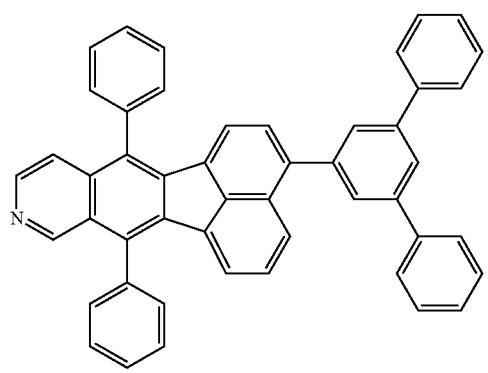
BD14
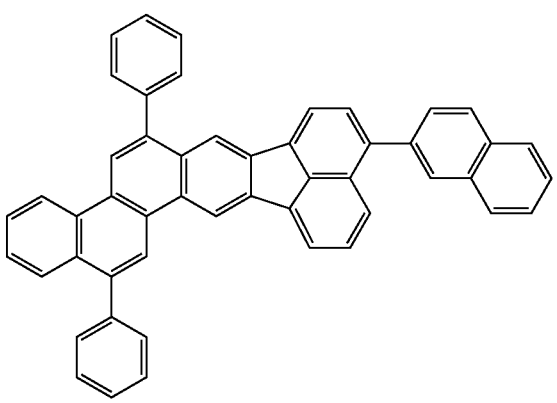

-continued
BD15
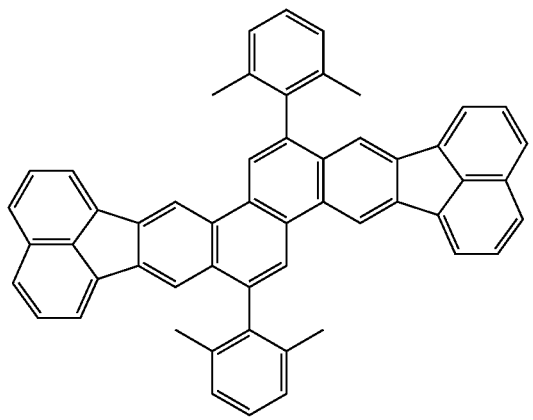
BD16
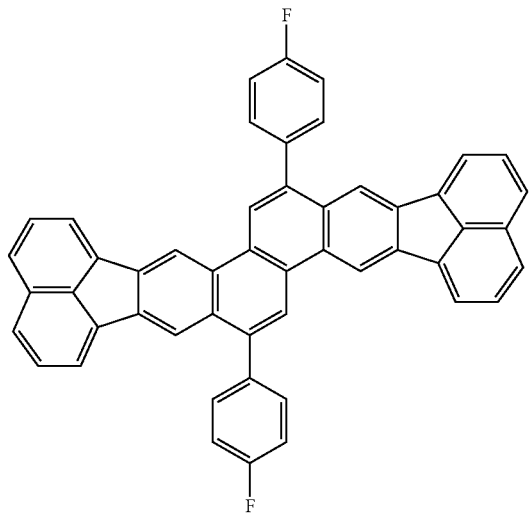
BD17
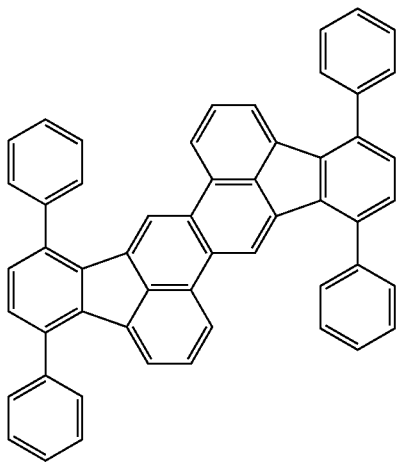
BD18
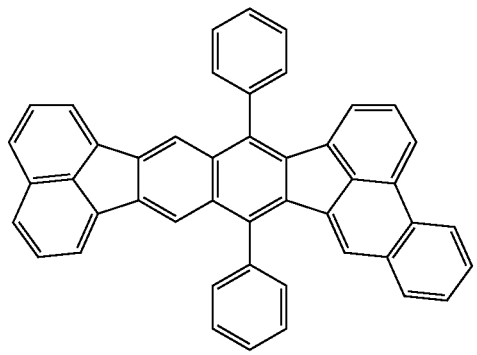
BD19
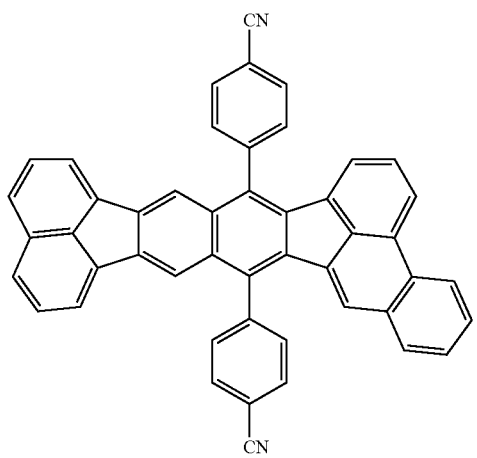
BD20
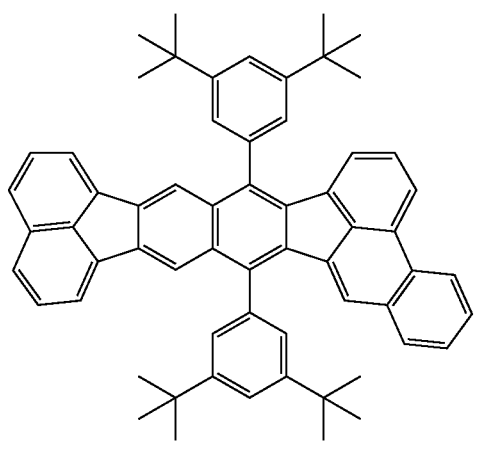

-continued
BD21
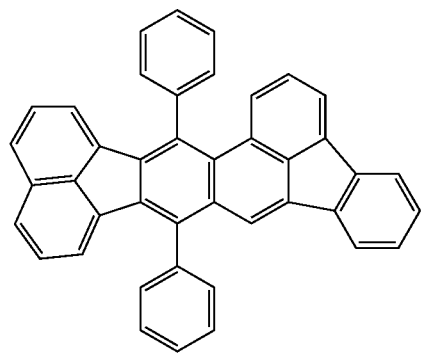
BD22
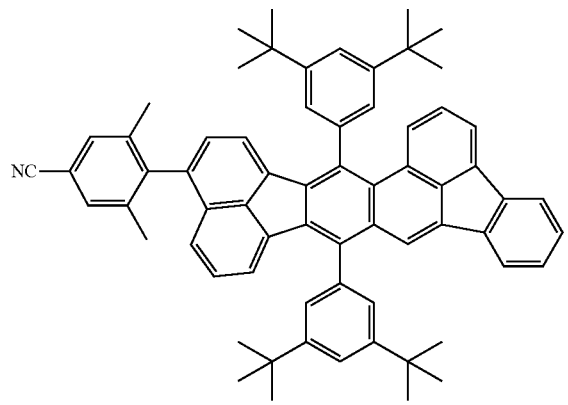
BD23
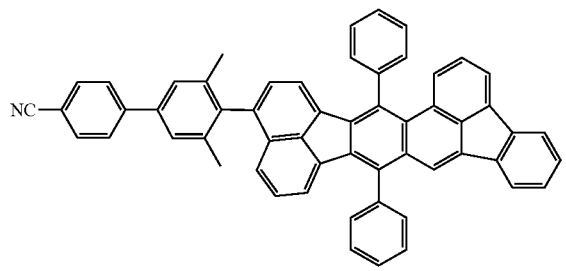
BD24
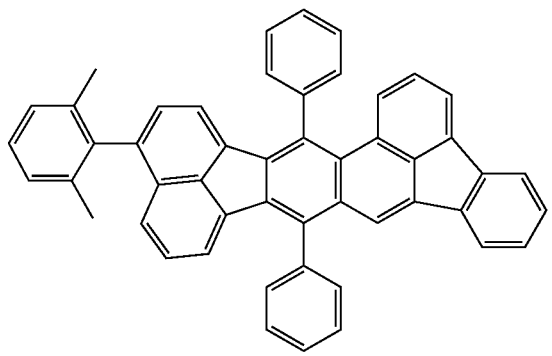
BD25
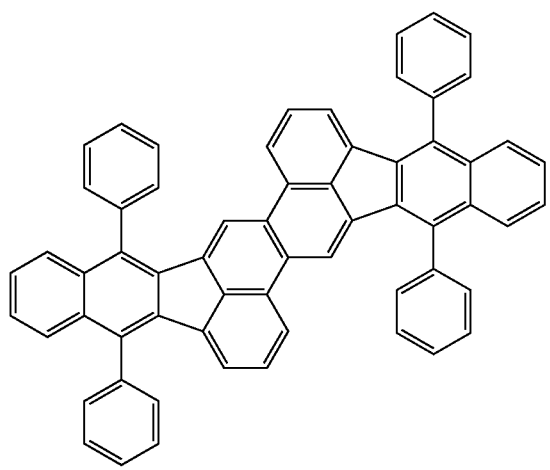
BD26
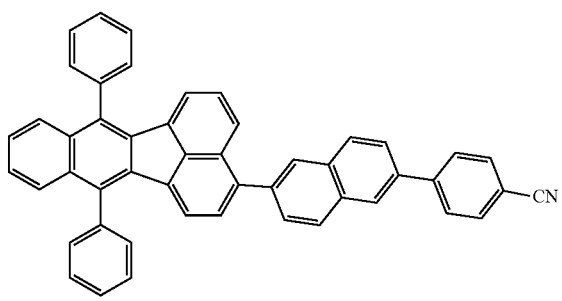

-continued

BD27
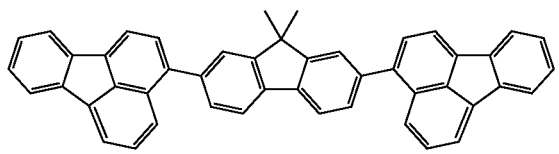

BD28
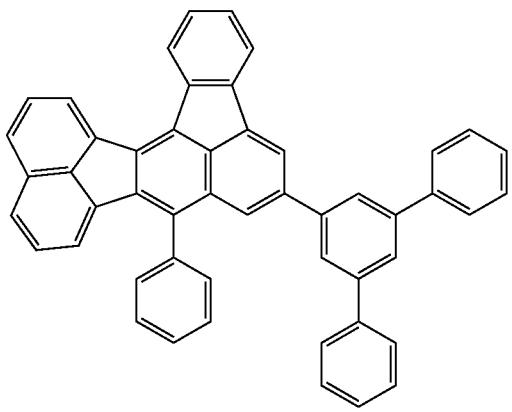

BD29
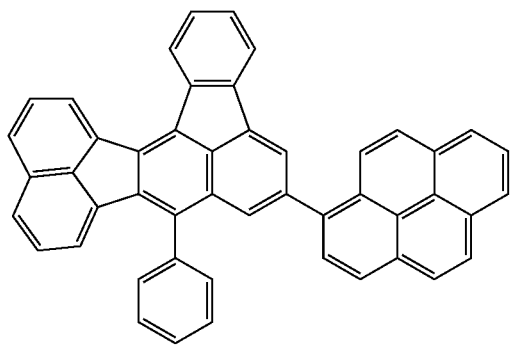

BD30
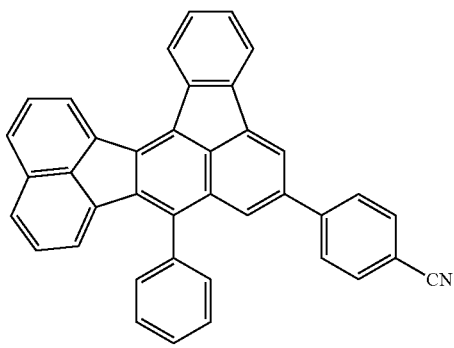

BD31
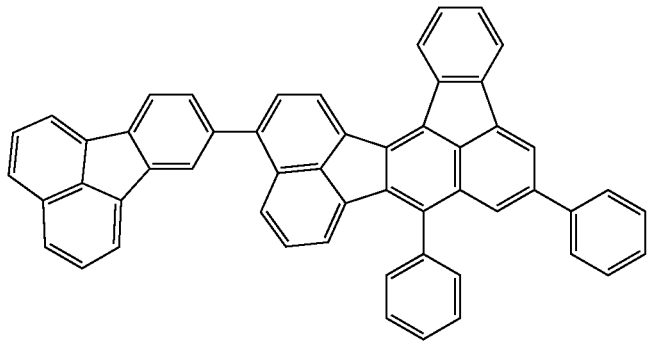

The blue-light-emitting dopant material is used in combination with the green-light-emitting dopant material in the first light-emitting layer 4-1. For the relations (i) and (ii) to be easily satisfied, the blue-light-emitting dopant material preferably does not have a substituted amino group, which has strong electron-donating properties, as described in (8). A compound having a cyano group, which has strong electron-withdrawing properties, may be used. The absence of a substituted amino group and the presence of a cyano group can deepen the LUMO energy of the dopant material and allow the relations (i) and (ii) to be easily satisfied.

The Doping Concentration of the Blue-Light-Emitting Dopant Material is Preferably 0.1 mass % or more and less than 5 mass %, more preferably 0.1 mass % or more and less than 1 mass %. An excessively low concentration may lead to an excessively weak blue light emission, resulting in a poor balance of red, green, and blue light emissions. An excessively high concentration may weaken red and green light emissions, resulting in a poor balance of red, green, and blue light emissions.

Structure of White Organic EL Element

The organic EL element according to this embodiment may have a structure including, in addition to the light-emitting layer, a hole injection layer, a hole transport layer, an electron blocking layer, a hole blocking layer, an electron transport layer, an electron injection layer, and the like. The structure of the organic EL element may be the following stacked structure, as illustrated in FIG. 1.

Substrate 1/anode 2/hole transport layer 3/second light-emitting layer 4-2/first light-emitting layer 4-1/electron transport layer 5/cathode 6

The first light-emitting layer 4-1 contains two dopant materials, that is, a green-light-emitting dopant material and a blue-light-emitting dopant material, and may be a light-emitting layer that is nearest to the cathode 6, as illustrated in FIG. 1.

The following stacked structure including the structure in FIG. 1 and, in addition, a hole injection layer, an electron blocking layer, a hole blocking layer, and an electron injection layer may also be used.

Substrate 1/anode 2/hole injection layer/hole transport layer 3/electron blocking layer/second light-emitting layer 4-2, first light-emitting layer 4-1/hole blocking layer/electron transport layer 5/electron injection layer/cathode 6

This element structure enables trapping of both electric charges, that is, holes and electrons, in the light-emitting layer and thus can provide a light-emitting element that undergoes no electric charge leakage and emits light with high efficiency.

Various other layer structures may be employed, for example: an insulating layer may be disposed at the interface between an electrode and an organic compound layer; an adhesive layer or an interference layer may be disposed; or the electron transport layer or the hole transport layer may be formed of two layers having different ionization potentials.

The organic EL element according to this embodiment may be of bottom-emission type in which light is emitted from the electrode on the substrate side or of top-emission type in which light is emitted from the side opposite the substrate, or may be configured to emit light from both sides. In particular, the organic EL element may be of top-emission type which allows the use of a light non-transmissive substrate such as a silicon substrate.

In addition to the organic compound in this embodiment, known low-molecular-weight and high-molecular-weight light-emitting dopants, hole injecting materials or hole transporting materials, compounds serving as host materials, light-emitting dopants, electron injecting materials or electron transporting materials, and the like may optionally be used in combination. Examples of these materials are shown below.

As a material used for the hole transport layer 3, a material that can facilitate injection of holes from the anode 2 or a material that has so high hole mobility that enables injected holes to be transported to the light-emitting layer may be used. These materials can also be used for the hole injection layer and the electron blocking layer. To prevent deterioration of film quality, such as crystallization, in the organic EL element, a material having a high glass-transition temperature may be used. Examples of low-molecular-weight and high-molecular-weight materials having high hole mobility include triarylamine derivatives, arylcarbazole derivatives, phenylenediamine derivatives, stilbene derivatives, phthalocyanine derivatives, porphyrin derivatives, poly(vinylcarbazole), poly(thiophene), and other conductive polymers. HT1 to HT19 are specific non-limiting examples of materials used for the hole transport layer 3.

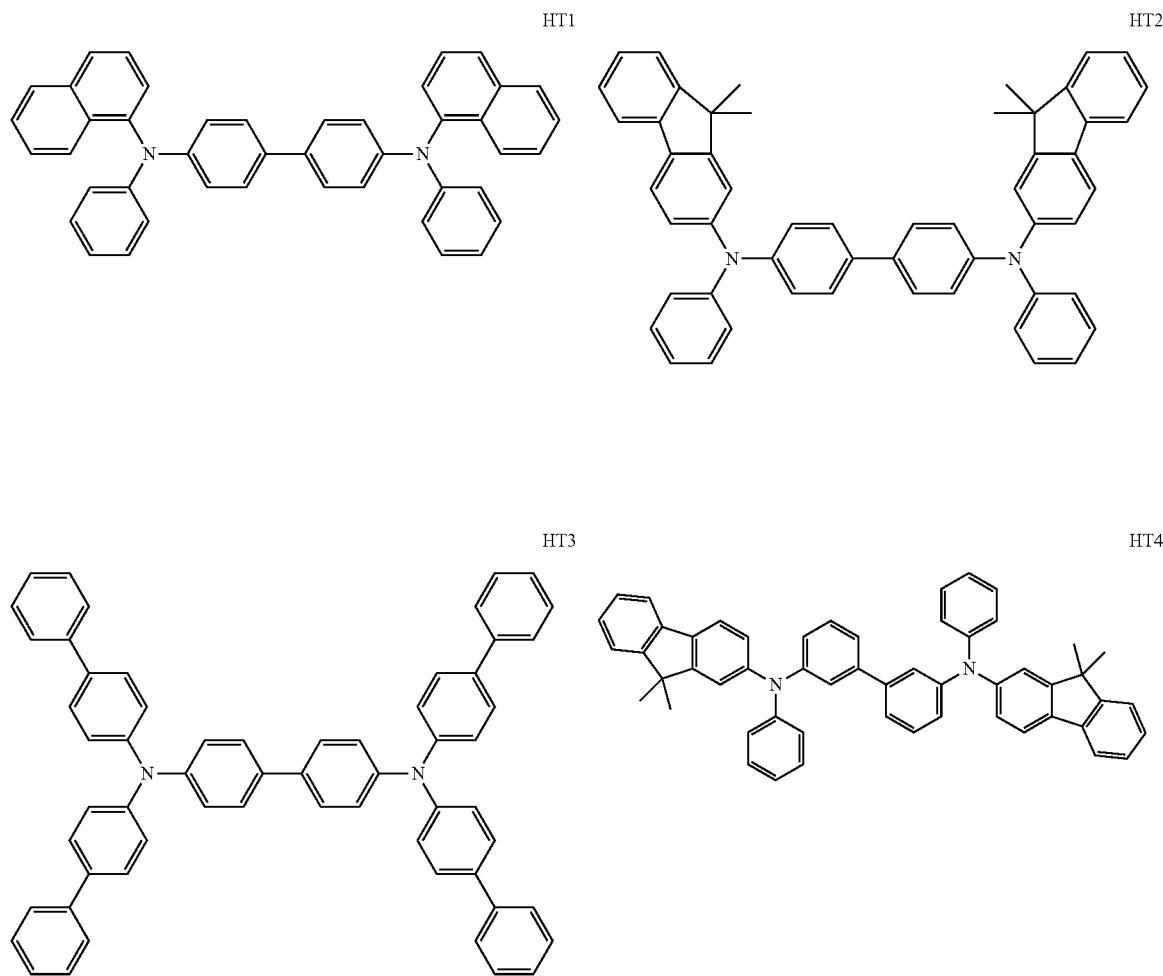

-continued
HT5
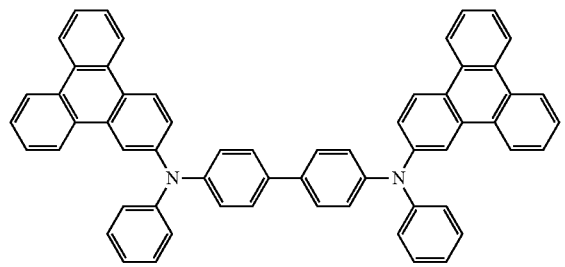
HT6
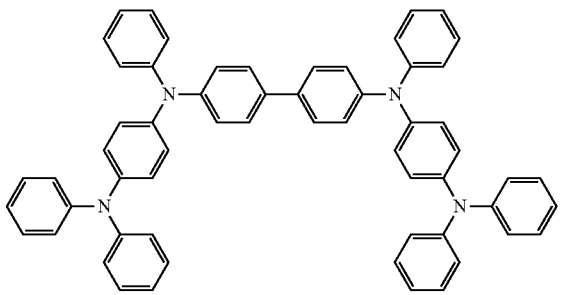
HT7
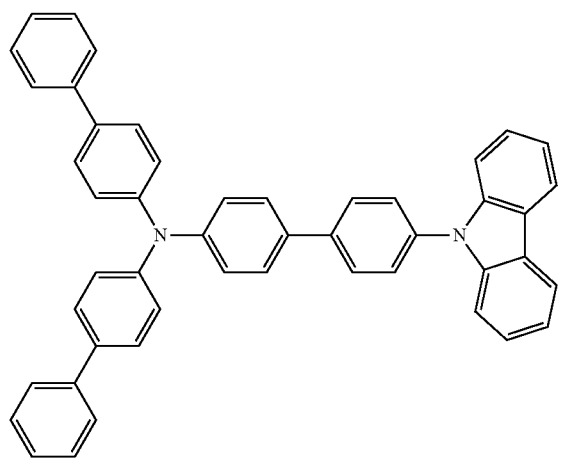
HT8
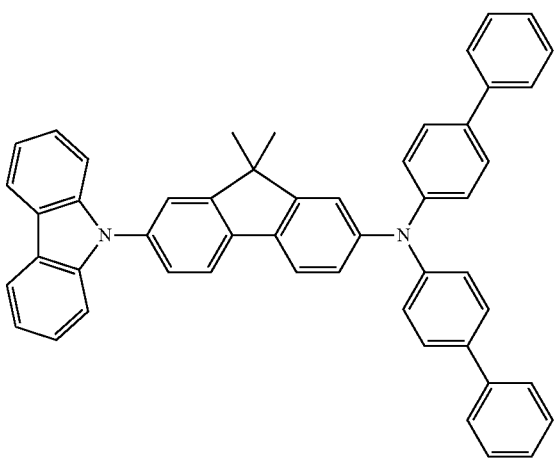
HT9
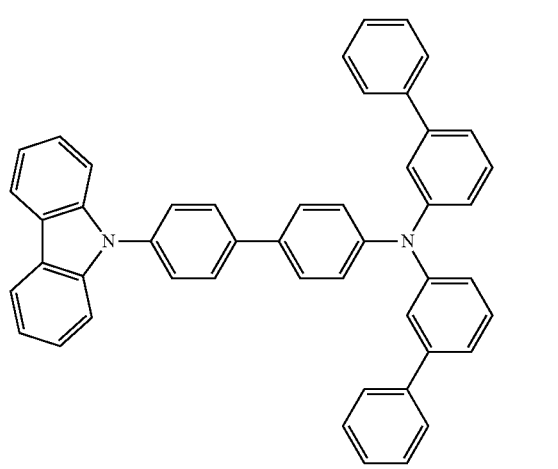
HT10
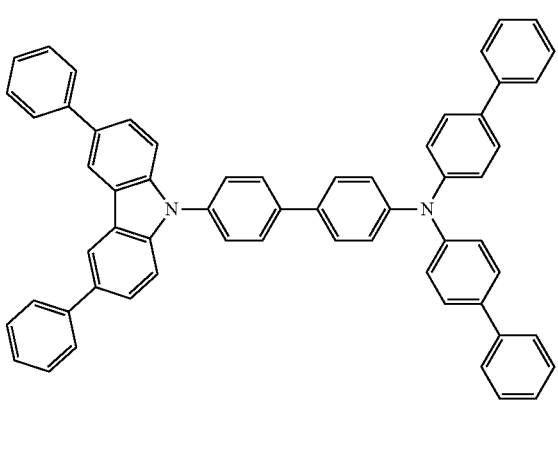
HT11
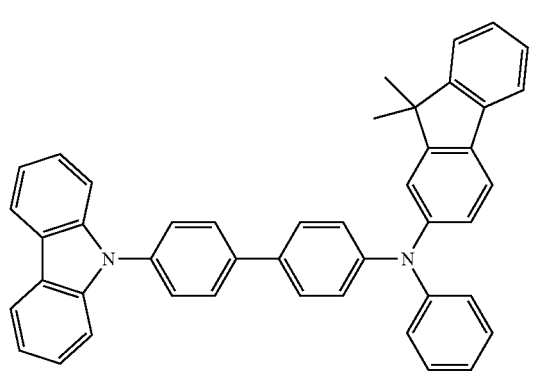
HT12
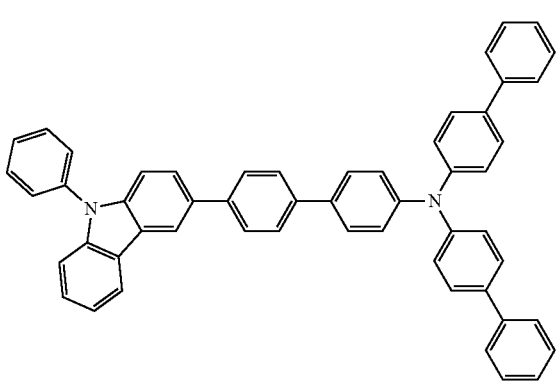

-continued
HT13
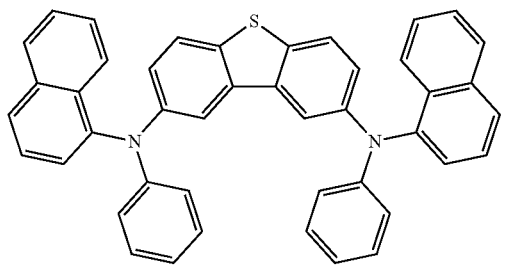
HT14
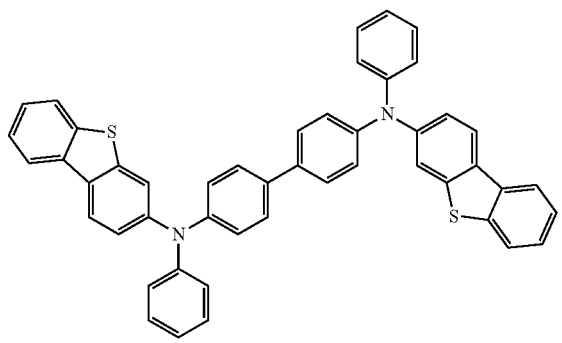
HT15
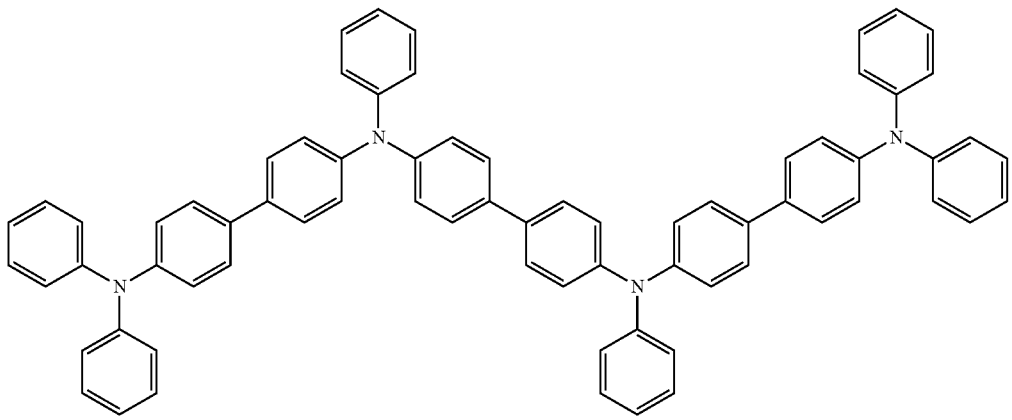
HT16
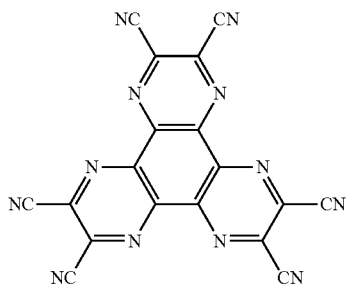
HT17
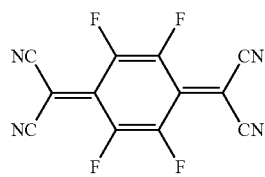
HT18
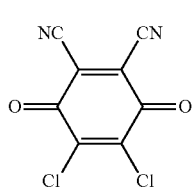
HT19
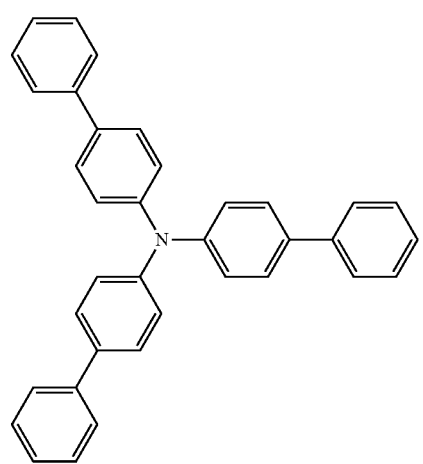

For the electron blocking layer, HT7, HT8, HT9, HT10, HT11, and HT12, each having a carbazole skeleton such as a carbazole group, may be used. The presence of a carbazole group deepens the HOMO level. This can create an energy level in which the HOMO level becomes gradually deeper in the order of the hole transport layer 3, the electron blocking layer, and the light-emitting layer, thus enabling holes to be injected into the light-emitting layer at a low voltage.

As a material used for the electron transport layer 5, any material capable of transporting electrons injected from the cathode 6 to the light-emitting layer can be freely selected taking into account, for example, the balance with the hole mobility of a hole transporting material. Such a material can also be used for the hole blocking layer and the electron injection layer. Examples of materials capable of transporting electrons include oxadiazole derivatives, oxazole derivatives, pyrazine derivatives, triazole derivatives, triazine derivatives, quinoline derivatives, quinoxaline derivatives, phenanthroline derivatives, organic aluminum complexes, and fused-ring compounds (e.g., fluorene derivatives, naphthalene derivatives, chrysene derivatives, and anthracene derivatives). These electron transporting materials are also suitable for use for the hole blocking layer. ET1 to ET23 are specific non-limiting examples of materials used for the electron transport layer 5.

ET1

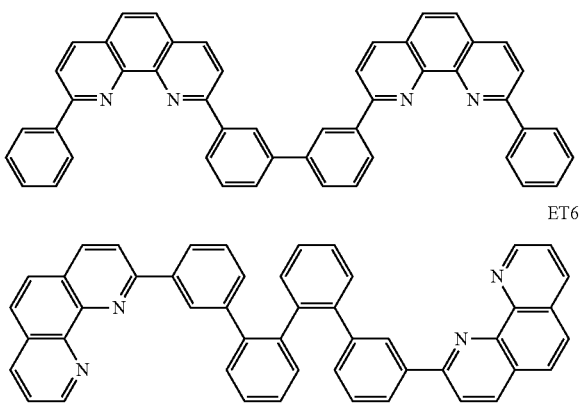

ET2

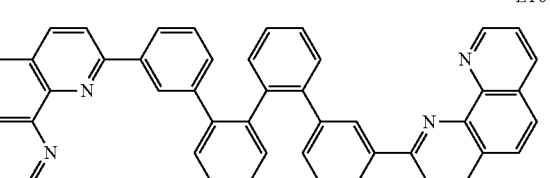

ET3

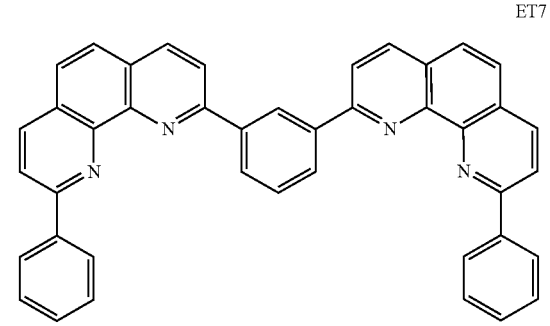

ET4

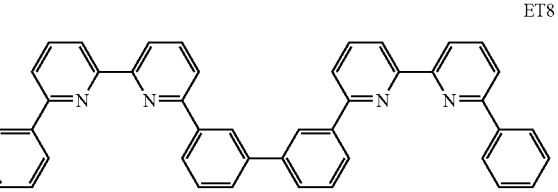

ET5

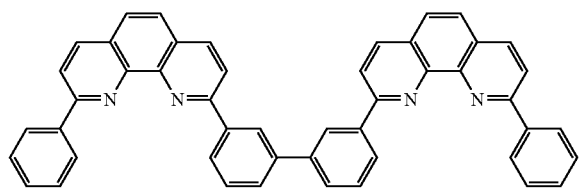

ET6

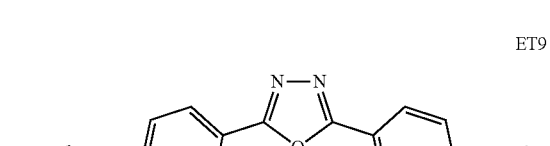

ET7

ET8

ET9

ET10

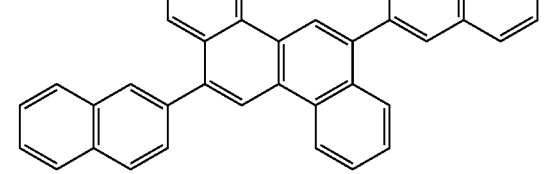

-continued
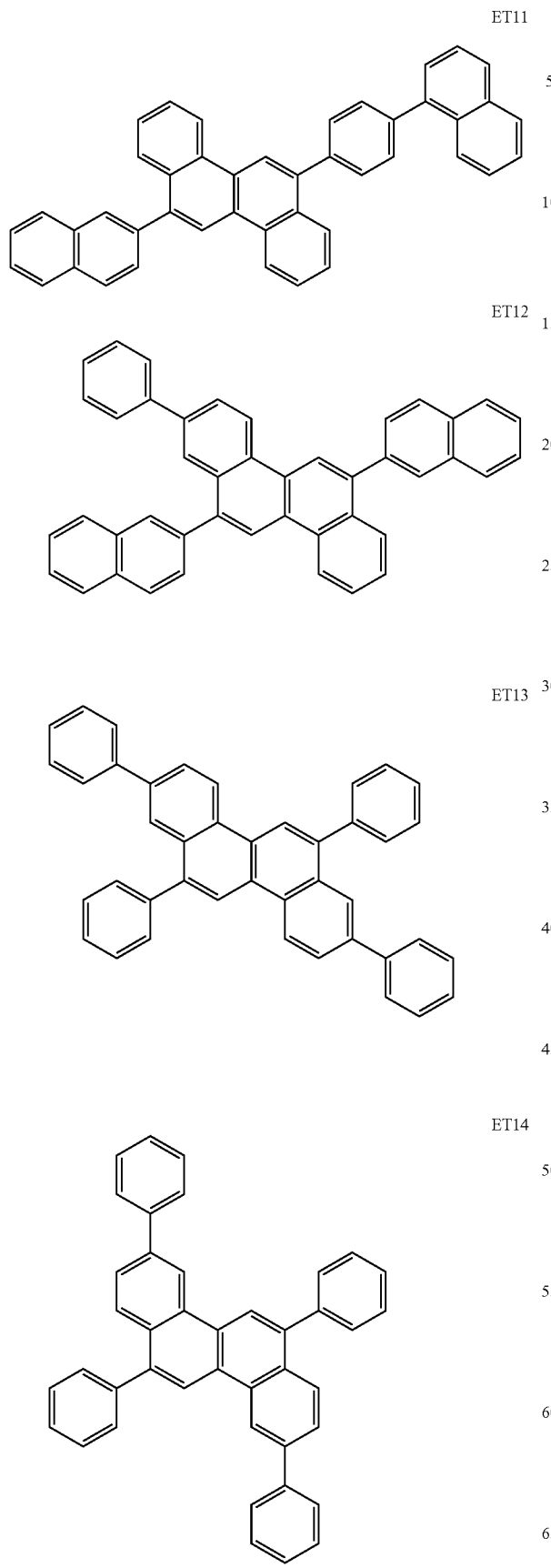
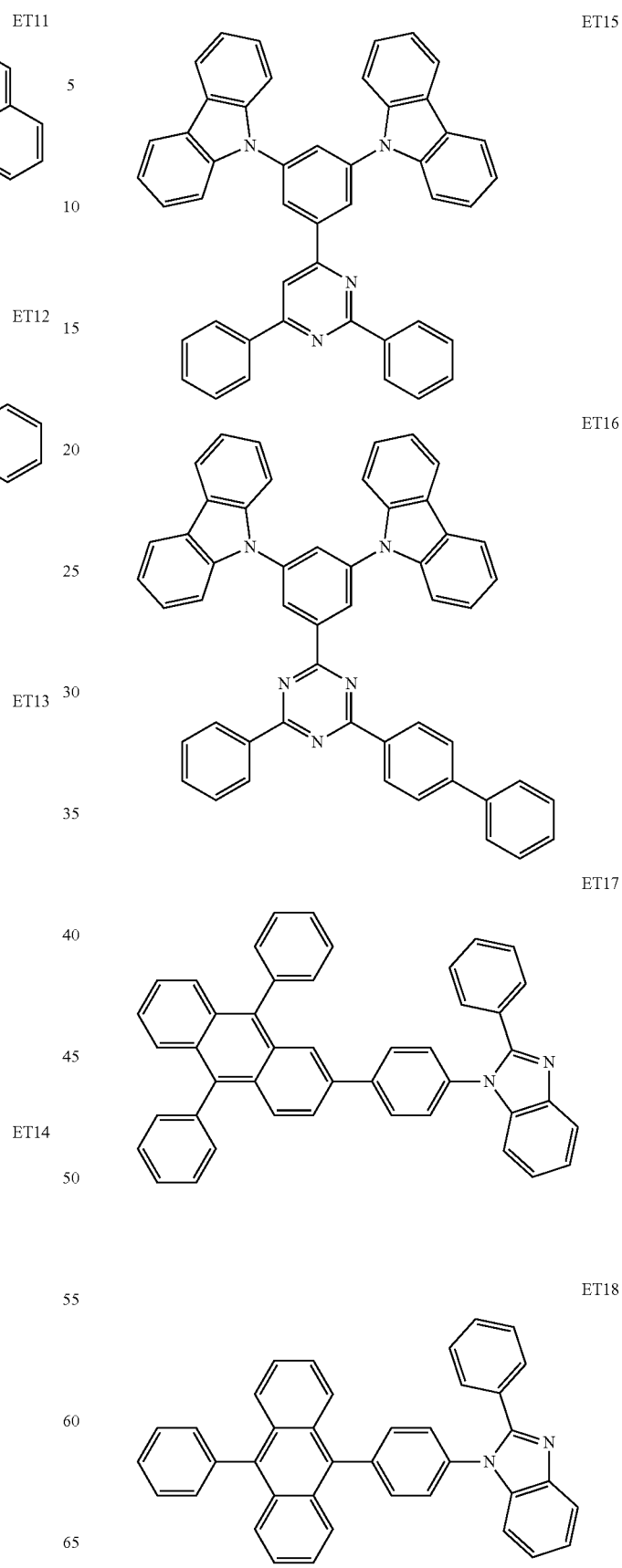

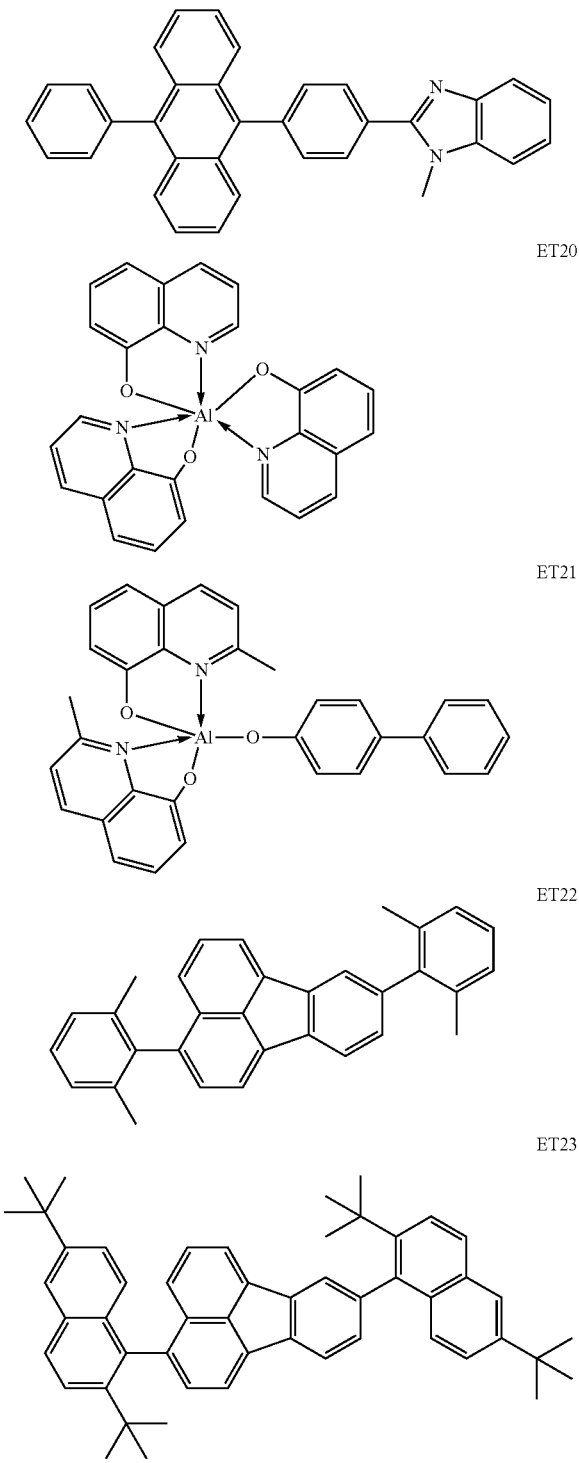

Among the electron transporting materials illustrated, the material for the hole blocking layer may be a hydrocarbon in terms of binding stability.

The material for the electron transport layer 5 may be a material having a pyridyl group or a phenanthrolyl group as a substituent, such as ET1, ET2, ET3, ET4, ET5, ET6, ET7, or ET8. This is because such a material interacts with electron injecting materials, such as alkali metal compounds, and electrode materials to help reduce the electron injection barrier.

The substrate 1 may be made of any material such as quartz, glass, silicon wafers, resins, and metals. The substrate 1 may have lines and switching elements such as transistors disposed thereon, and an insulating layer may be disposed thereon. The insulating layer may be any layer through which a contact hole can be formed in order to provide an electrical connection between the anode 2 and a line and which also provides insulation for an unconnected line. For example, resins such as polyimide, silicon oxide, and silicon nitride can be used.

The anode 2 may be made of a material having as high a work function as possible. For example, metals such as gold, platinum, silver, copper, nickel, palladium, cobalt, selenium, vanadium, and tungsten, mixtures containing these metals, alloys of these metals, and metal oxides such as tin oxide, zinc oxide, indium oxide, indium tin oxide (ITO), and indium zinc oxide can be used. Conductive polymers such as polyaniline, polypyrrole, and polythiophene can also be used. These electrode materials can be used alone or in combination. The anode 2 may be formed of a single layer or multiple layers. When the anode 2 is used as a reflection electrode, chromium, aluminum, silver, titanium, tungsten, molybdenum, an alloy thereof, an oxide thereof, a nitride thereof, or a laminate thereof can be used, for example. When the anode 2 is used as a transparent electrode, a transparent conductive oxide layer of, for example, indium tin oxide (ITO) or indium zinc oxide can be used, but these are not limiting examples. Photolithography can be used for electrode formation.

The cathode 6 may be made of a material having as low a work function as possible. Examples of such materials include alkali metals such as lithium; alkaline earth metals such as calcium and magnesium; metals such as aluminum, titanium, manganese, silver, lead, and chromium; and mixtures containing these metals. Alloys of these metals can also be used. For example, magnesium-silver, aluminum-lithium, aluminum-magnesium, silver-copper, and zinc-silver alloys can be used. Metal oxides such as indium tin oxide (ITO) can also be used. These electrode materials can be used alone or in combination. The cathode 6 may be formed of a single layer or multiple layers. The cathode 6 may also be a thin conductive oxide layer formed of, for example, Ag, a Ag alloy, or ITO to provide a top-emission element. The cathode 6 may be formed by any method, for example, DC and AC sputtering methods and vapor deposition methods.

After the cathode 6 is formed, a sealing member (not illustrated) may be disposed. For example, bonding a glass plate provided with a moisture absorbent to the cathode 6 can reduce permeation of water into organic compound layers, thus reducing the occurrence of a display failure. In another embodiment, a passivation film made of, for example, aluminum oxide or silicon nitride may be disposed on the cathode 6 to reduce permeation of water into organic compound layers. For example, a sealing film may be formed in such a manner that the cathode 6, after being formed, is conveyed to another chamber without breaking the vacuum, and a silicon nitride film having a thickness of 2 μm is formed thereon by CVD.

Color filters may be disposed on pixels. For example, color filters sized to fit pixels may be disposed on another substrate and bonded to a substrate provided with the organic EL element. Alternatively, color filters may be patterned by photolithography on a sealing film made of, for example, silicon nitride.

The organic compound layers (e.g., the hole injection layer, the hole transport layer, the electron blocking layer, the light-emitting layer, the hole blocking layer, the electron transport layer, and the electron injection layer) constituting the organic EL element according to this embodiment are formed by the following method.

The organic compound layers constituting the organic EL element according to this embodiment can each be formed using a dry process such as vacuum deposition, ionized deposition, sputtering, or plasma deposition. Alternatively, the organic compound layers can each be formed using a wet process by applying a solution of an organic compound in an appropriate solvent by a known coating method (e.g., spin coating, dipping, casting, the LB technique, or ink-jet coating). Layers formed by vacuum deposition or solution coating are unlikely to undergo deterioration such as crystallization and are highly stable over time. When a coating method is used, an appropriate binder resin can be used in combination to form a film.

Examples of binder resins include, but are not limited to, polyvinylcarbazole resins, polycarbonate resins, polyester resins, ABS resins, acrylic resins, polyimide resins, phenol resins, epoxy resins, silicone resins, and urea resins. These binder resins may be used alone as a homopolymer or copolymer or may be used as a mixture of two or more. In addition, known additives such as plasticizers, antioxidants, and UV absorbers may optionally be used in combination.

Apparatuses Including White Organic EL Element

The white organic EL element according to this embodiment can be used as a component of a display device or a lighting apparatus. Other applications include an exposure light source in an electrophotographic image-forming apparatus, a backlight in a liquid crystal display device, and a light-emitting apparatus including a white light source with a color filter. The color filter may be, for example, a filter that allows red, green, or blue light to pass therethrough.

The display device may be an image information processing apparatus including an image input unit that receives image information from, for example, an area CCD, a linear CCD, and a memory card, an information-processing unit that processes the input information, and a display unit that displays the input image. The display unit of an image pickup apparatus or an ink-jet printer may have a touch panel function. The touch panel function may be activated by any system, such as an infrared system, an electrostatic capacitive system, a resistive film system, or an electromagnetic induction system. The display device may also be used in a display unit of a multifunctional printer.

The organic EL element according to this embodiment has an emission luminance that is controlled by a TFT, which is an example of a switching element. Disposing a plurality of the organic EL elements in a screen enables a display of an image with different emission luminances. The switching element according to this embodiment need not necessarily be a TFT and may be a transistor formed of low-temperature polysilicon or an active matrix driver formed on a substrate such as a Si substrate. The active matrix driver may also be formed in the substrate. This is selected according to the level of resolution. For example, in the case of 1-inch size and about a QVGA resolution, the organic EL element may be disposed on a Si substrate. Driving the display device including the organic EL element according to this embodiment enables a stable display with high image quality over a long period of time.

Display Device

Figure 3:
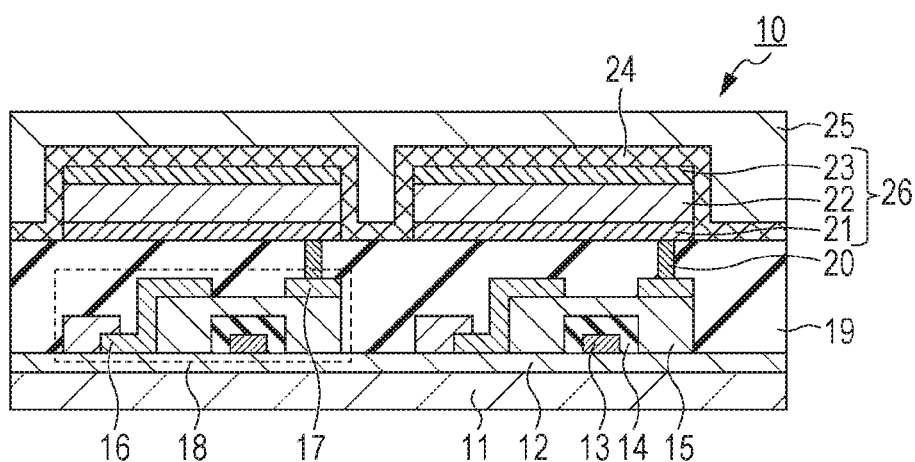
FIG. 3 is a schematic sectional view illustrating an example of a display device according to this embodiment.

FIG. 3 is a schematic sectional view illustrating an example of a display device according to this embodiment and illustrates an example of a display device including an organic EL element and a TFT element connected to the organic EL element. The TFT element is an example of an active element. The display device according to this embodiment may include red, green, and blue color filters. The red, green, and blue color filters may be disposed in a delta arrangement.

A display device 10 in FIG. 3 includes a substrate 11 made of, for example, glass and a moisture-proof film 12 thereon for protecting a TFT element 18 or an organic compound layer 22. The TFT element 18 includes a gate electrode 13 made of metal, a gate insulating film 14, a semiconductor layer 15, a drain electrode 16, and a source electrode 17. An insulating film 19 is disposed on the TFT element 18. An anode 21 constituting the organic EL element and the source electrode 17 are connected to each other through a contact hole 20. The electrodes (the anode 21 and a cathode 23) in the organic EL element and the electrodes (the source electrode 17 and the drain electrode 16) in the TFT need not necessarily be electrically connected to each other in the manner illustrated in FIG. 3. It is only required that either the anode 21 or the cathode 23 be electrically connected to either the source electrode 17 or the drain electrode 16 in the TFT element. Although the organic compound layer 22 is illustrated as a single layer in the display device 10 in FIG. 3, the organic compound layer 22 may be composed of multiple layers. A first protective layer 24 and a second protective layer 25 for preventing deterioration of the organic EL element are disposed over the cathode 23.

Although a transistor is used as a switching element in the display device 10 in FIG. 3, an MIM element may be used as a switching element instead. The transistor used in the display device 10 in FIG. 3 may not only be a transistor obtained using a single-crystal silicon wafer but also a thin-film transistor including a substrate and an active layer on an insulating surface of the substrate. The active layer may be made of, for example, single-crystal silicon, non-single-crystal silicon such as amorphous silicon or microcrystalline silicon, or a non-single-crystal oxide semiconductor such as indium zinc oxide or indium gallium zinc oxide. The thin-film transistor is also referred to as a TFT element. The transistor in the display device 10 in FIG. 3 may be formed in a substrate such as a Si substrate. The phrase "formed in a substrate" means producing a transistor by processing a substrate itself, such as a Si substrate. That is, having a transistor in a substrate can also mean that a substrate and a transistor are integral with each other. Whether the transistor is provided in a substrate is selected according to the level of resolution. For example, in the case of 1-inch size and about a QVGA resolution, the transistor may be disposed in a Si substrate.

Figure 4:
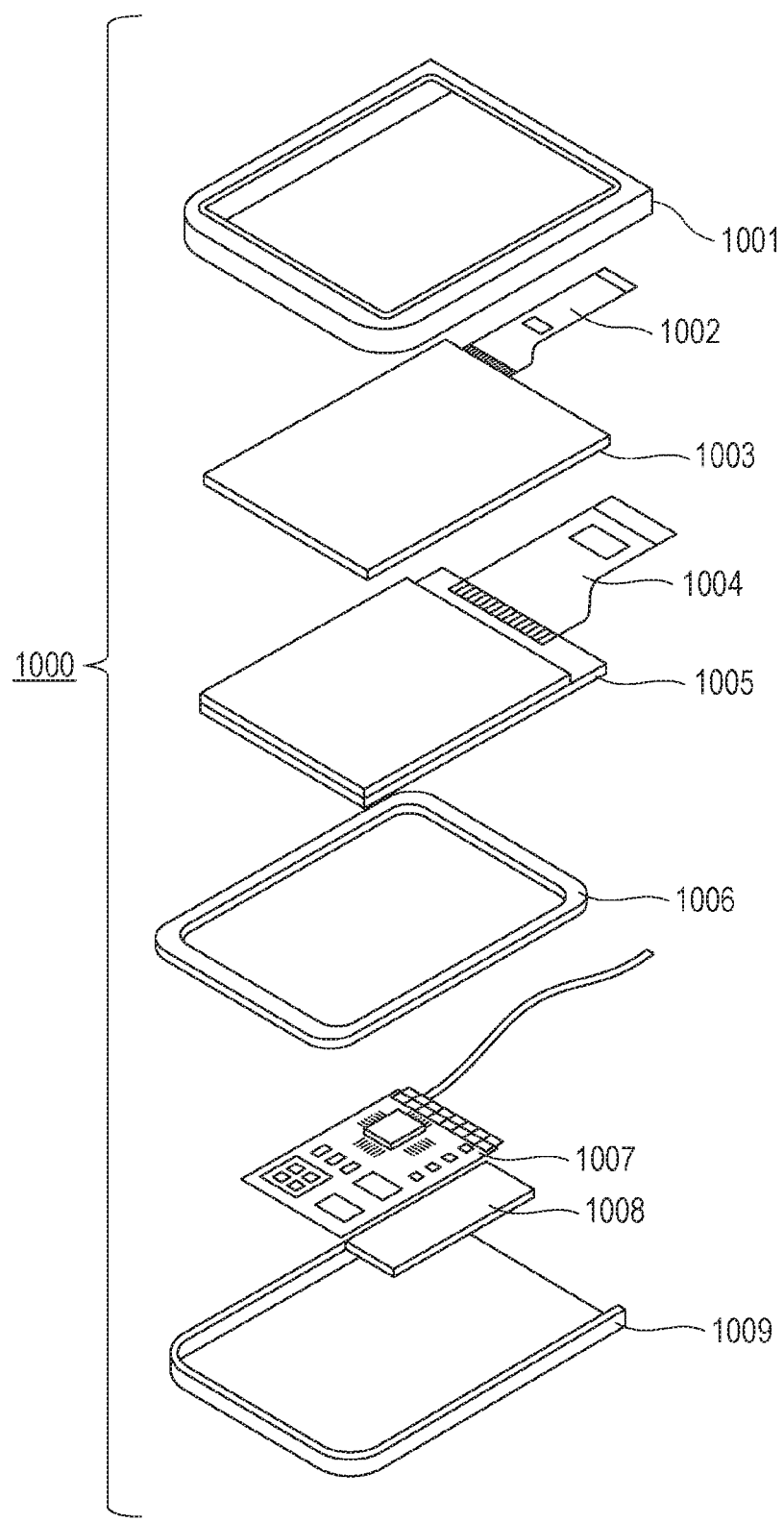
FIG. 4 is a schematic view illustrating an example of a display device according to this embodiment.

FIG. 4 is a schematic view illustrating an example of a display device according to this embodiment. A display device 1000 may include an upper cover 1001, a lower cover 1009, and a touch panel 1003, a display panel 1005, a frame 1006, a circuit board 1007, and a battery 1008 disposed between the upper cover 1001 and the lower cover 1009. Flexible print circuits (FPCs) 1002 and 1004 are connected to the touch panel 1003 and the display panel 1005, respectively. The organic light-emitting element according to this embodiment may be used in the display panel 1005. A circuit including a transistor is disposed on the circuit board 1007. The battery 1008 may be omitted if the display device is not a mobile device. If the display device is a mobile device, the battery 1008 need not necessarily be disposed at this position.

Figure 5A:
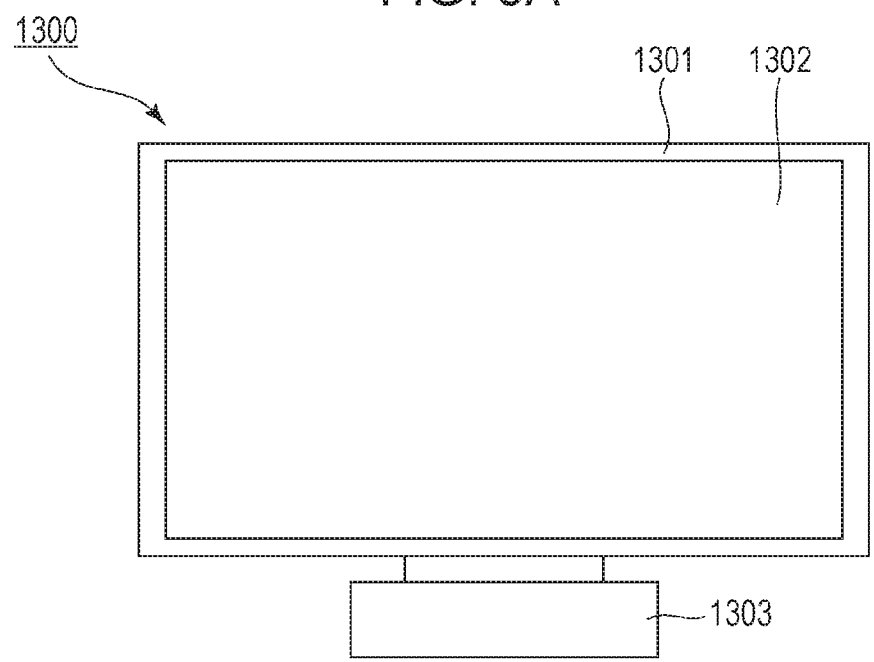
FIGS. 5A and 5B are schematic views illustrating examples of display devices according to this embodiment.
Figure 5B:
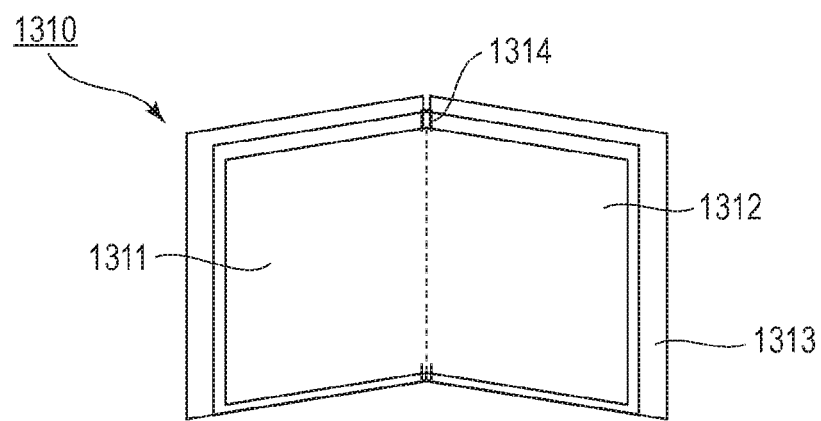

FIGS. 5A and 5B are schematic views illustrating examples of display devices according to this embodiment. FIG. 5A illustrates a display device such as a television monitor or a PC monitor. A display device 1300 includes a frame 1301 and a display unit 1302. The organic EL element according to this embodiment may be used in the display unit 1302. The display device 1300 includes a base 1303 that supports the frame 1301 and the display unit 1302. The base 1303 need not necessarily be in the form illustrated in FIG. 5A. The lower side of the frame 1301 may serve as a base. The frame 1301 and the display unit 1302 may be curved. The radius of curvature may be 5000 mm or more and 6000 mm or less. A display device 1310 in FIG. 5B is configured to be folded and what is called a foldable display device. The display device 1310 includes a first display unit 1311, a second display unit 1312, a housing 1313, and a bending point 1314. The first display unit 1311 and the second display unit 1312 may each include the organic EL element according to this embodiment. The first display unit 1311 and the second display unit 1312 may be a seamless, monolithic display device. The first display unit 1311 and the second display unit 1312 can be divided by the bending point. The first display unit 1311 and the second display unit 1312 may display different images, or the first and second display units may together display a single image.

Image Pickup Apparatus

The display device according to this embodiment may be used in a display unit of an image pickup apparatus that includes an optical unit including a plurality of lenses and an image pickup element that receives light that has passed through the optical unit. The image pickup apparatus may include a display unit that displays information acquired by the image pickup element. The display unit may be exposed to the outside of the image pickup apparatus or disposed in a viewfinder. The image pickup apparatus may be a digital camera or a digital camcorder.

Figure 6:
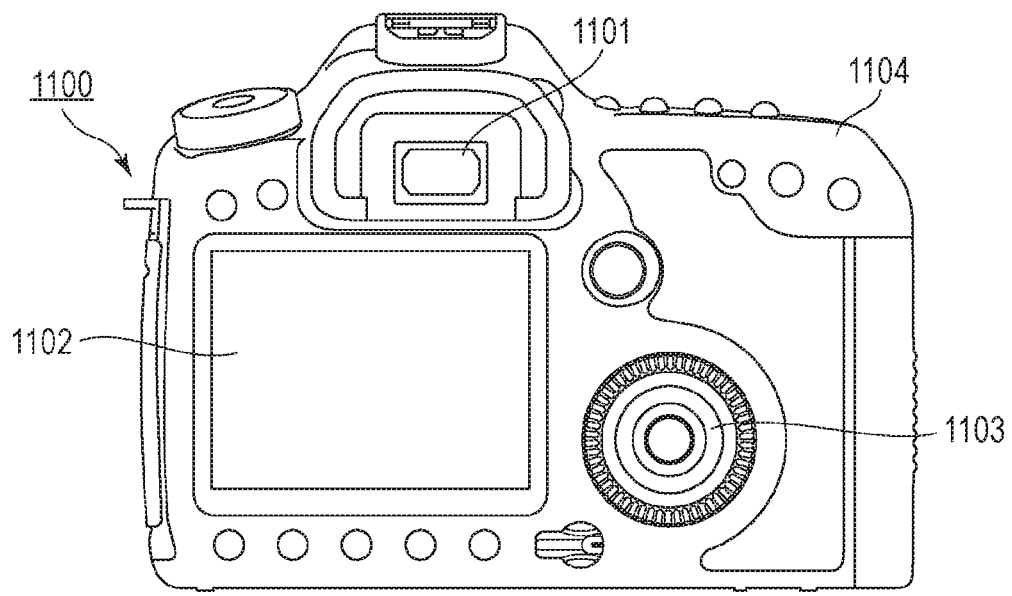
FIG. 6 is a schematic view illustrating an example of an image pickup apparatus according to this embodiment.

FIG. 6 is a schematic view illustrating an example of an image pickup apparatus according to this embodiment. An image pickup apparatus 1100 may include a viewfinder 1101, a rear display 1102, an operation unit 1103, and a housing 1104. The viewfinder 1101 may include the display device according to this embodiment. In this case, the display device may display not only an image to be captured but also environmental information, image capture instructions, and the like. The environmental information may be, for example, the intensity of external light, the direction of external light, the moving speed of a subject, and the possibility that the subject is hidden by an object. Since the timing appropriate for capturing an image is only a moment, the information is desirably displayed as quickly as possible. Thus, the display device including the organic EL element of the present disclosure may be used. This is because the organic EL element has a high response speed. The display device including the organic EL element is more suitable for use as a device required to have a high display speed than liquid crystal display devices. The image pickup apparatus 1100 includes an optical unit (not illustrated). The optical unit includes a plurality of lenses and focuses an image on the image pickup element accommodated in the housing 1104. By adjusting the relative positions of the plurality of lenses, the focal point can be adjusted. This operation can also be performed automatically.

Electronic Device

The display device according to this embodiment may be used in a display unit of an electronic device such as a mobile terminal. In this case, the display device may have both a display function and an operating function. Examples of mobile terminals include cellular phones such as smart phones, tablets, and head mount displays.

Figure 7:
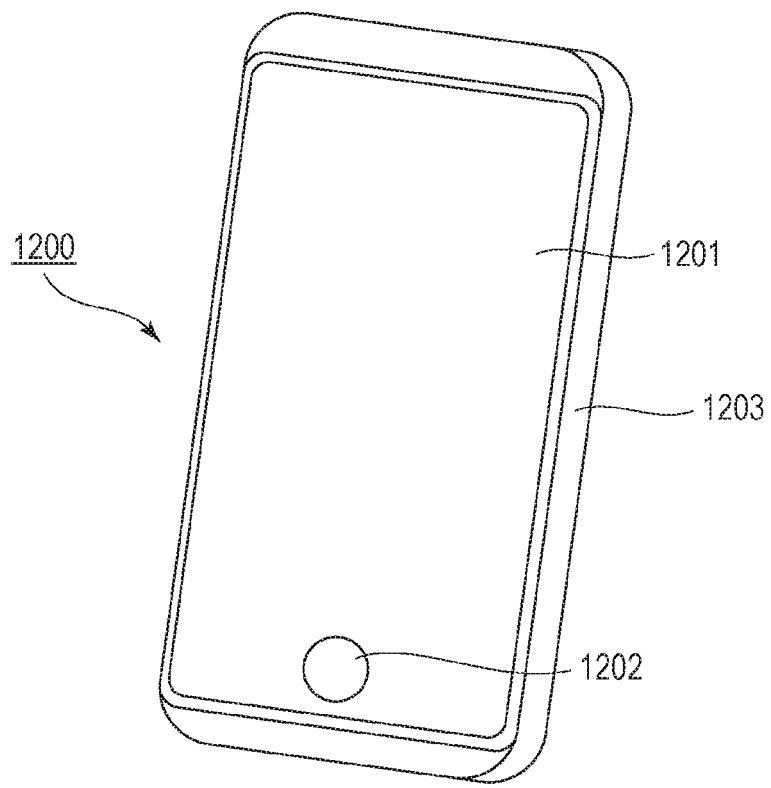
FIG. 7 is a schematic view illustrating an example of a mobile device according to this embodiment.

FIG. 7 is a schematic view illustrating an example of an electronic device according to this embodiment. An electronic device 1200 includes a display unit 1201, an operation unit 1202, and a housing 1203. The housing 1203 may include a circuit, a printed board including the circuit, a battery, and a communication unit. The operation unit 1202 may be a button or a touch-sensitive response unit. The operation unit may be a biometric recognition unit that, for example, releases a lock through recognition of fingerprints. An electronic device including a communication unit can also be referred to as a communication device.

Lighting Apparatus

Figure 8:
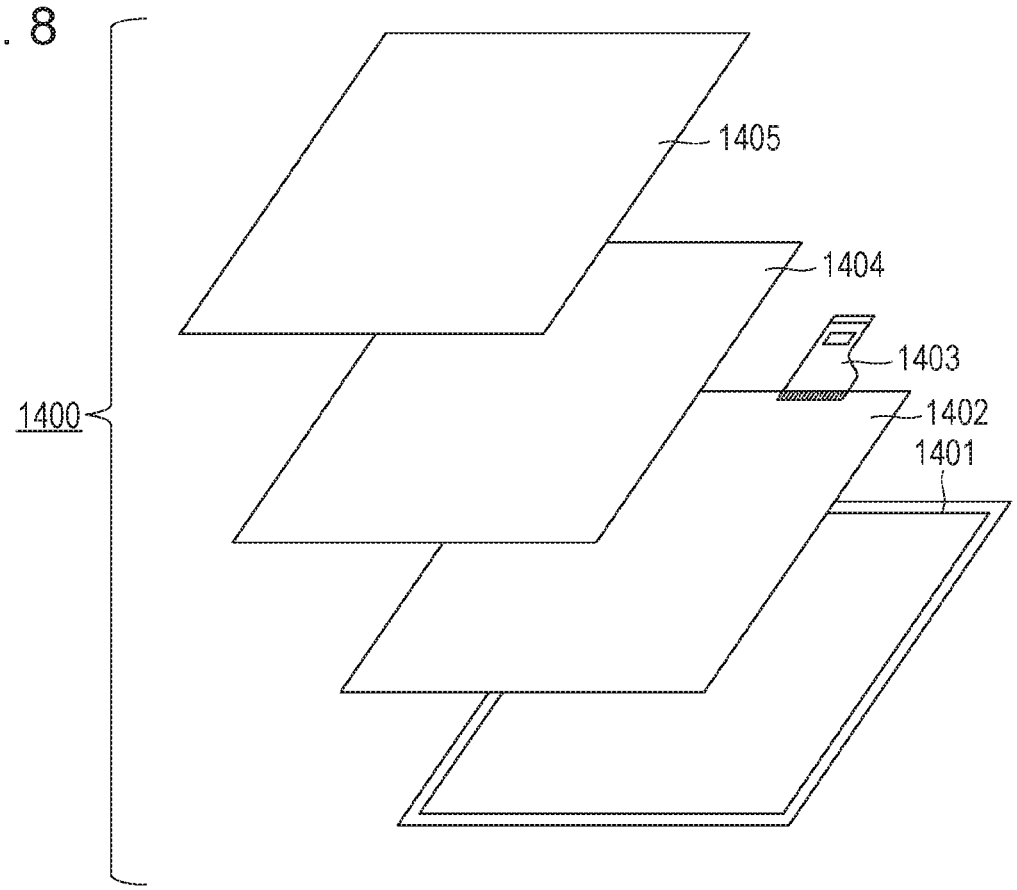
FIG. 8 is a schematic view illustrating an example of a lighting apparatus according to this embodiment.

FIG. 8 is a schematic view illustrating an example of a lighting apparatus according to this embodiment. A lighting apparatus 1400 may include a housing 1401, a light source 1402, a circuit board 1403, an optical filter 1404, and a light diffusion unit 1405. The light source 1402 may include the organic EL element according to this embodiment. The optical filter 1404 may be a filter for improving the color rendering properties of the light source 1402. The light diffusion unit 1405 effectively diffuses light from the light source 1402 and helps the light reach a wide region for, for example, lighting up. The optical filter 1404 and the light diffusion unit 1405 may be disposed on the light-emitting side of the lighting apparatus. Optionally, a cover may be disposed at an outermost portion.

The lighting apparatus is, for example, an apparatus that lights a room. The lighting apparatus may emit light of cool white, day white, or any other color from blue to red. The lighting apparatus may include a modulation circuit that modulates the light. The lighting apparatus may include the organic EL element of the present disclosure and a power supply circuit connected thereto. The power supply circuit is a circuit that converts AC voltage to DC voltage. Cool white has a color temperature of 4200 K, and day white has a color temperature of 5000 K. The lighting apparatus may include a color filter.

The lighting apparatus according to this embodiment may also include a heat dissipation unit. The heat dissipation unit dissipates heat out of the apparatus and may be made of, for example, a metal having a high specific heat or liquid silicon.

Moving Object

Figure 9:
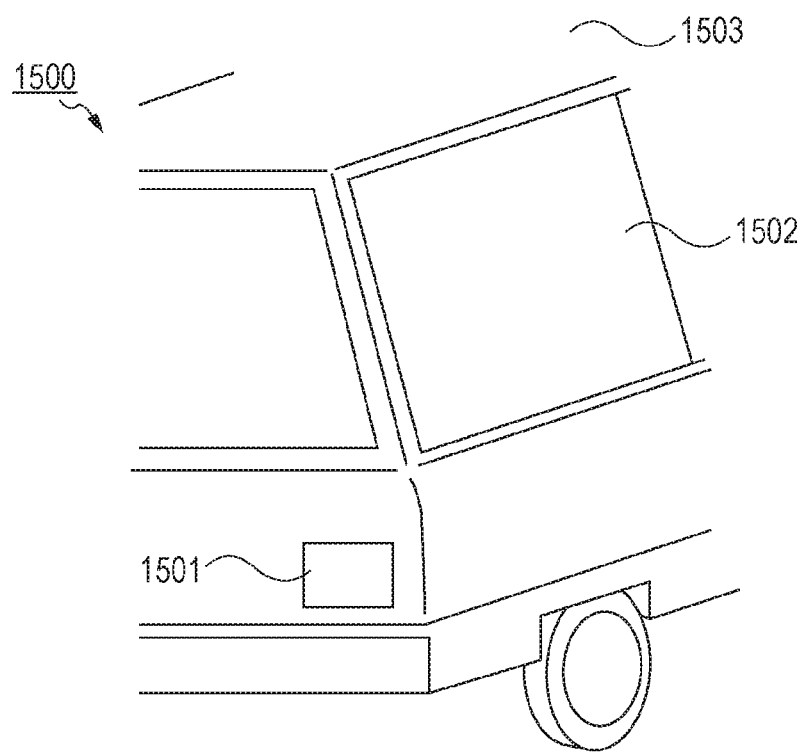
FIG. 9 is a schematic view illustrating an example of a moving object according to this embodiment.

A moving object according to this embodiment includes a body and a lighting fixture mounted to the body. FIG. 9 is a schematic view illustrating an example of the moving object according to this embodiment and illustrates an automobile including a tail lamp, which is an example of a vehicle lighting fixture. An automobile 1500, which is an example of a moving object, includes a tail lamp 1501, and the tail lamp 1501 may be configured to be turned on in response to, for example, brake operation. The tail lamp 1501 may include the organic EL element according to this embodiment. The tail lamp 1501 may include a protective member that protects the organic EL element. The protective member may be made of any material that is strong to some extent and transparent, preferably a polycarbonate or the like. A mixture of a polycarbonate and, for example, a furandicarboxylic acid derivative or an acrylonitrile derivative may be used. The automobile 1500 may include a car body 1503 and a window 1502 attached thereto. The window 1502 may be a transparent display unless it is a window for checking the front and rear of the automobile 1500. The transparent display may include the organic EL element according to this embodiment. In this case, components, such as electrodes, of the organic EL element are made of transparent materials.

The moving object according to this embodiment may be, for example, a ship, an aircraft, or a drone. The moving object may include a body and a lighting fixture disposed on the body. The lighting fixture may emit light for allowing the position of the body to be recognized. The lighting fixture includes the organic EL element according to this embodiment.

EXAMPLES

Evaluations of HOMO and LUMO

Host materials and dopant materials were evaluated as described below.
The results are shown in Table 2.
A) Method of Evaluating HOMO
A 30-nm-thick thin film was formed on an aluminum substrate, and the HOMO of the thin film was measured using an AC-3 (manufactured by RIKEN KEIKI Co., Ltd.).
B) Method of Evaluating LUMO
A 30-nm-thick thin film was formed on a quartz substrate, and using the thin film as a target material, its optical band gap (absorption edges) was determined with a spectrophotometer (V-560 manufactured by JASCO Corporation). The optical band gap value was added to the above HOMO value to determine LUMO. The results are shown in Table 2.

Table 2 also shows calculated values obtained by molecular orbital calculation. Comparisons between the calculated values and the measured values show that HOMO and LUMO energies are correlated with each other. Thus, in the following EXAMPLES, HOMO and LUMO energy values determined from the calculated values are used to discuss the elements.

TABLE 2

|  |  | Measured value | | Calculated value | |
| --- | --- | --- | --- | --- | --- |
|  | Compound | HOMO (eV) | LUMO (eV) | HOMO (eV) | LUMO (eV) |
| Host | EM1 | −6.02 | −3.10 | −5.11 | −1.67 |
|  | EM2 | −5.96 | −3.04 | −5.06 | −1.62 |
|  | EM3 | −5.94 | −2.95 | −5.14 | −1.62 |
|  | EM4 | −6.00 | −3.01 | −5.19 | −1.66 |
|  | EM5 | −6.03 | −3.06 | −5.12 | −1.64 |
|  | EM7 | −6.01 | −3.13 | −5.02 | −1.70 |
|  | EM10 | −6.31 | −2.83 | −5.67 | −1.21 |

TABLE 2-continued

|  |  | Measured value | | Calculated value | |
| --- | --- | --- | --- | --- | --- |
|  | Compound | HOMO (eV) | LUMO (eV) | HOMO (eV) | LUMO (eV) |
|  | EM13 | −5.99 | −3.06 | −5.13 | −1.46 |
|  | EM17 | −5.73 | −3.53 | −4.68 | −2.07 |
|  | EM22 | −5.80 | −3.20 | −4.94 | −1.77 |
|  | EM27 | −6.22 | −3.11 | −5.73 | −1.87 |
| Blue dopant | BD1 | −5.46 | −2.67 | −4.73 | −1.47 |
|  | BD4 | −5.56 | −2.77 | −5.08 | −1.49 |
|  | BD8 | −6.05 | −3.26 | −5.18 | −1.72 |
|  | BD9 | −6.08 | −3.38 | −5.24 | −1.84 |
|  | BD15 | −6.10 | −3.40 | −5.20 | −1.91 |
|  | BD19 | −6.11 | −3.48 | −5.49 | −2.21 |
|  | BD20 | −5.90 | −3.30 | −5.04 | −1.82 |
|  | BD23 | −6.20 | −3.52 | −5.44 | −2.06 |
|  | BD24 | −6.08 | −3.38 | −5.32 | −1.94 |
|  | BD25 | −6.10 | −3.40 | −5.02 | −1.91 |
| Green dopant | GD3 | −5.40 | −2.60 | −4.74 | −1.83 |
|  | GD4 | −5.58 | −3.03 | −4.70 | −1.85 |
|  | GD7 | −5.77 | −3.57 | −5.00 | −1.97 |
|  | GD9 | −5.94 | −3.45 | −5.02 | −1.96 |
|  | GD10 | −5.87 | −3.49 | −5.01 | −1.98 |
|  | GD11 | −5.82 | −3.51 | −5.00 | −1.97 |
|  | GD22 | −5.90 | −3.40 | −5.02 | −2.06 |
|  | GD27 | −5.84 | −3.52 | −4.95 | −2.08 |
| Red dopant | RD2 | −5.40 | −3.30 | −4.65 | −2.30 |
|  | RD5 | −5.62 | −3.63 | −4.72 | −2.37 |
|  | RD10 | −5.60 | −3.55 | −4.98 | −2.58 |
|  | RD15 | −5.55 | −3.50 | −4.63 | −2.34 |
|  | RD21 | −5.65 | −3.61 | −4.87 | −2.52 |

Example 1

In this Example, a top-emission-type organic EL element was produced in which an anode, a hole injection layer, a hole transport layer, an electron blocking layer, a second light-emitting layer, a first light-emitting layer, a hole blocking layer, an electron transport layer, an electron injection layer, and a cathode were sequentially formed on a substrate.

A Ti film with a thickness of 40 nm was formed on a glass substrate by a sputtering method and patterned by photolithography to form an anode. At this time, the area of the electrode facing a cathode was set to 3 mm². Subsequently, the cleaned substrate on which the electrode had been formed and materials were placed in a vacuum deposition apparatus (manufactured by ULVAC, Inc.). The apparatus was evacuated to $1.0 \times 10^{-4}$ Pa ($1 \times 10^{-6}$ Torr), and UV/ozone cleaning was then performed. Thereafter, layers were formed so as to be configured as shown in Table 3.

TABLE 3

|  | Material | | | Thickness (nm) |
| --- | --- | --- | --- | --- |
| Hole injection layer | HT16 | | | 7 |
| Hole transport layer | HT2 | | | 18 |
| Electron blocking layer | HT7 | | | 10 |
| Second light-emitting layer (red and green light-emitting layer) | Host | EM1 | Mass ratio | 7 |
|  | Red dopant | RD5 | EM1:RD5:GD10 = | |
|  | Green dopant | GD10 | 97.6:0.4:2.0 | |
| First light-emitting layer (green and blue light-emitting layer) | Host | EM1 | Mass ratio | 13 |
|  | Green dopant | GD10 | EM1:BD24:GD10 = | |
|  | Blue dopant | BD24 | 99.3:0.6:0.1 | |
| Hole blocking layer | ET12 | | | 70 |
| Electron transport layer | ET2 | | | 30 |
| Electron injection layer | LiF | | | 0.8 |
| Cathode | Mg | | Mass ratio | 12 |
|  | Ag | | Mg:Ag = 50:50 | |

After the cathode is formed, the substrate was transferred to a glove box, and in a nitrogen atmosphere, the glove box was sealed with a glass cap containing a desiccant to obtain a white organic EL element. The white organic EL element satisfies above (1), which is a feature of the present disclosure, and also satisfies (3) to (13), which are desirable features.

The white organic EL element obtained was connected to a voltage application device and evaluated for its properties. Current-voltage characteristics were measured with a 4140B microammeter manufactured by Hewlett-Packard Company, and an "SR-3" manufactured by TOPCON Corporation was used to obtain an emission spectrum and evaluate chromaticity. Emission luminance was measured with a BM7 manufactured by TOPCON Corporation.

Figure 10:
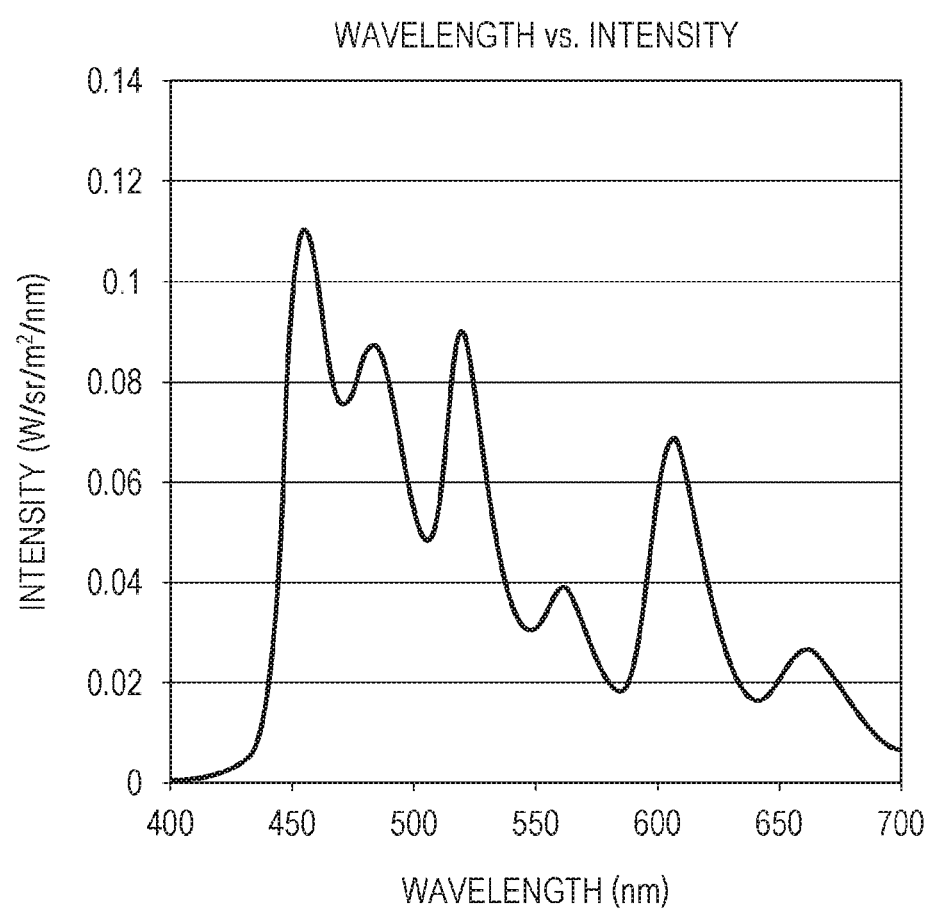
FIG. 10 is an emission spectrum of a white organic EL element in Example 1.

The efficiency, the voltage, and the CIE chromaticity coordinates during display at 1000 cd/m$^2$ were 5.6 cd/A, 3.9 V, and (0.31, 0.35), respectively. That is, the white organic EL element was a good element that had high efficiency and a low drive voltage and underwent little change in white emission chromaticity when subjected to voltage variation. FIG. 10 shows a white spectrum obtained.

Next, spectra and luminances in the cases where red, green, and blue color filters were formed on the white organic EL element were determined by calculation. Using the EL elements of the three colors, the current required during white (CIE chromaticity coordinates: 0.31, 0.33) display at 500 cd/m$^2$ was calculated for red, green, and blue colors. The results were as follows: red, 70 mA/cm$^2$; green, 85 mA/cm$^2$; blue, 77 mA/cm$^2$; indicating that a white organic EL element able to provide well-balanced red, green, and blue light emissions was obtained.

Example 2

An element was produced and evaluated in the same manner as in Example 1 except that a green-light-emitting dopant was not added to the second light-emitting layer (mass ratio "EM1:RD5=99.6:0.4") to make the second light-emitting layer serve as a red-light-emitting layer, and the concentration of the green-light-emitting dopant in the first light-emitting layer was increased to 0.3 mass % (mass ratio "EM1:BD24:GD10=99.1:0.6:0.3"). The white organic EL element satisfies above (2), which is a feature of the present disclosure, and also satisfies (3) to (13), which are desirable features.

Figure 11:
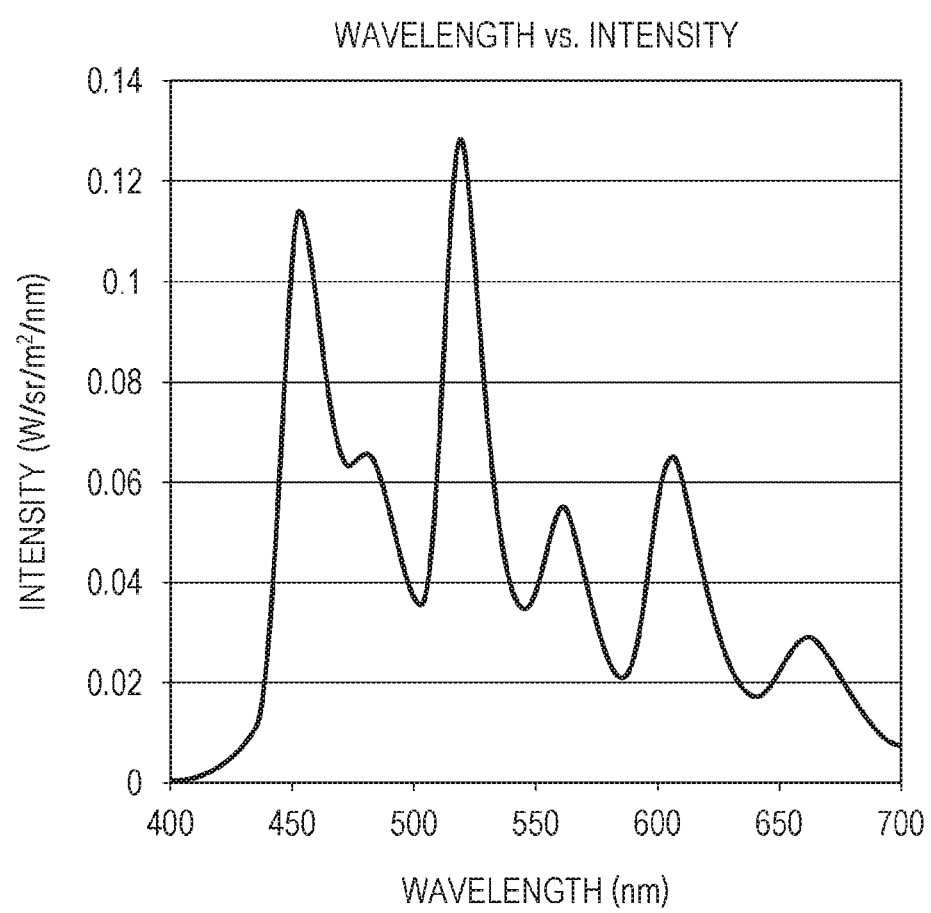
FIG. 11 is an emission spectrum of a white organic EL element in Example 2.

The efficiency, the voltage, and the CIE chromaticity coordinates during display at 1000 cd/m$^2$ were 7.3 cd/A, 4.1 V, and (0.28, 0.36), respectively. That is, the white organic EL element had a green emission luminance higher than that in Example 1 and thus had high efficiency. FIG. 11 shows a white spectrum obtained.

Next, spectra and luminances in the cases where red, green, and blue color filters were formed on the white organic EL element were determined by calculation. Using the EL elements of the three colors, the current required during white (CIE chromaticity coordinates: 0.31, 0.33) display at 500 cd/m$^2$ was calculated for red, green, and blue colors. The results were as follows: red, 84 mA/cm$^2$; green, 63 mA/cm$^2$; blue, 70 mA/cm$^2$; indicating that a white organic EL element able to provide well-balanced red, green, and blue light emissions was obtained.

Comparative Example 1

An element was produced and evaluated in the same manner as in Example 1 except that a green-light-emitting dopant was not added to the first light-emitting layer (mass ratio "EM1:BD24=99.4:0.6") to make the first light-emitting layer serve as a blue-light-emitting layer.

Figure 12:
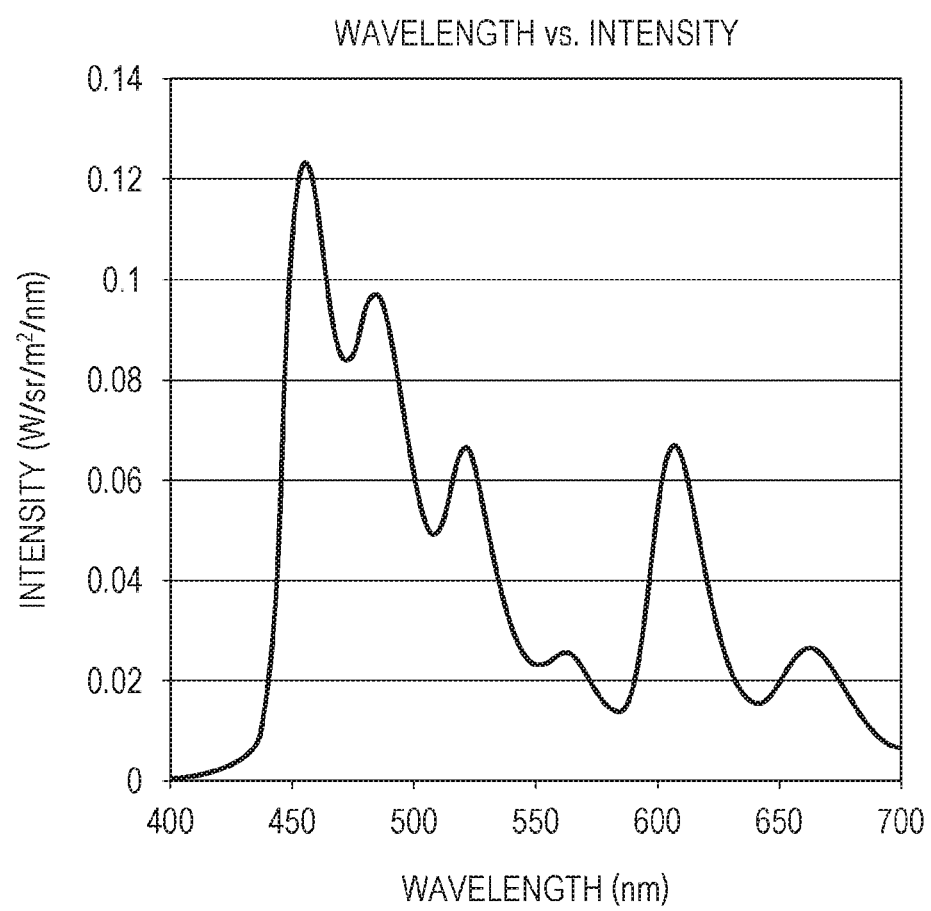
FIG. 12 is an emission spectrum of a white organic EL element in Comparative Example 1.

The efficiency, the voltage, and the CIE chromaticity coordinates during display at 1000 cd/m$^2$ were 4.8 cd/A, 3.9 V, and (0.31, 0.29), respectively. That is, the white organic EL element, as compared to Example 1, had a high blue emission luminance but a low green emission luminance and thus had low efficiency. FIG. 12 shows a white spectrum obtained. When the voltage was reduced to lower the emission luminance, the ratio of red light emission increased to change the white emission chromaticity.

Next, as in Example 1, the current required during white (CIE chromaticity coordinates: 0.31, 0.33) display at 500 cd/m$^2$ in the cases where red, green, and blue color filters were formed was calculated for red, green, and blue colors. The results were as follows: red, 71 mA/cm$^2$; green, 110 mA/cm$^2$; blue, 67 mA/cm$^2$; indicating that the white organic EL element, as compared to Example 1, had a low green luminance and a high blue luminance and thus was poorly balanced. Specifically, since the first light-emitting layer served as a blue-light-emitting layer, green light was emitted only from the second light-emitting layer, and the second light-emitting layer emitted light of two colors in one light-emitting layer; thus, it was difficult to control the balance between green and red light emissions.

Comparative Example 2

An element was produced and evaluated in the same manner as in Example 2 except that the host material of the second light-emitting layer was replaced with EM20.

Figure 13:
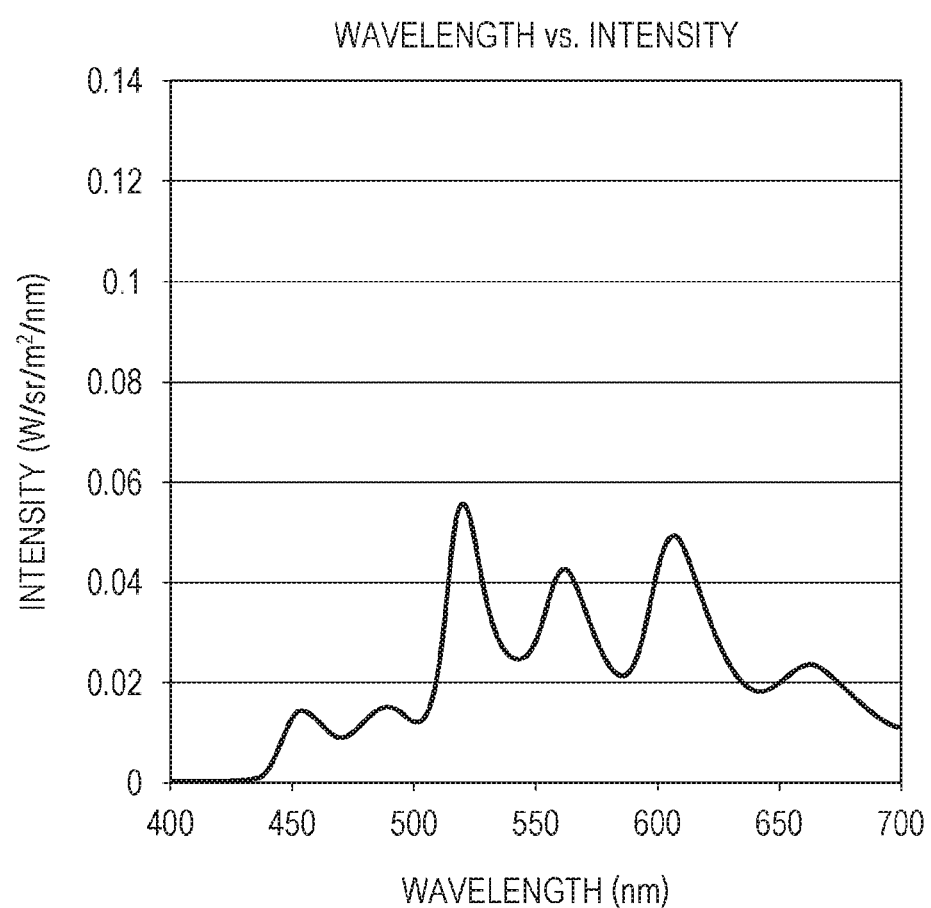
FIG. 13 is an emission spectrum of a white organic EL element in Comparative Example 2.

The efficiency, the voltage, and the CIE chromaticity coordinates during display at 1000 cd/m$^2$ were 4.1 cd/A, 4.9 V, and (0.41, 0.47), respectively. That is, the white organic EL element had low emission luminance, particularly, a low blue emission luminance FIG. 13 shows a white spectrum obtained.

The low emission luminance is probably due to the following reason. As compared to Example 2, the host material of the second light-emitting layer was different from that of the first light-emitting layer, and thus holes did not readily flow from the first light-emitting layer serving as a red-light-emitting layer to the second light-emitting layer.

According to the present disclosure, a white organic EL element can be provided that has a low drive voltage, that provides well-balanced red, green, and blue light emissions, and that undergoes little change in white emission chromaticity when subjected to voltage variation.

While the present disclosure has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-217283, filed Nov. 20, 2018, and Japanese Patent Application No. 2019-121417, filed Jun. 28, 2019, which are hereby incorporated by reference herein in their entirety.

What is claimed is:

1. An organic electroluminescent (EL) element comprising:
   a first electrode;
   a second electrode; and
   a light-emitting layer disposed between the first electrode and the second electrode, wherein the light-emitting layer includes a first light-emitting layer and a second light-emitting layer,
the first light-emitting layer and the second light-emitting layer each contain a host material and a light-emitting dopant material,
the first light-emitting layer contains a green-light-emitting dopant material and a blue-light-emitting dopant material and emits green light and blue light, and
the second light-emitting layer contains a red-light-emitting dopant material and a green-light-emitting dopant material and emits red light and green light,
wherein at least one of the light-emitting dopant materials has a fused ring including a five-membered ring,
and wherein the second light-emitting layer satisfies relations (iii) and (iv):
(iii) LUMO (H)<LUMO (RD)
(iv) LUMO (H)<LUMO (GD)
where LUMO (H) is an absolute value of a lowest unoccupied molecular orbital (LUMO) energy of the host material,
LUMO (RD) is an absolute value of a LUMO energy of the red-light-emitting dopant material, and
LUMO (GD) is an absolute value of a LUMO energy of the green-light-emitting dopant material.

2. The organic EL element according to claim 1, wherein the first light-emitting layer and the second light-emitting layer are in contact with each other, and
the host material of the first light-emitting layer is the same as the host material of the second light-emitting layer.

3. The organic EL element according to claim 1, wherein the green-light-emitting dopant material is present in the second light-emitting layer at a concentration of 1 mass % or more and less than 5 mass %.

4. The organic EL element according to claim 1, wherein the first electrode is a reflective electrode that reflects light, the second electrode is a transmissive electrode that transmits light, and the anode, the second light-emitting layer, the first light-emitting layer, and the cathode are disposed in this order.

5. The organic EL element according to claim 1, wherein the first light-emitting layer satisfies relations (i) and (ii):
(i) LUMO (H)<LUMO (BD)
(ii) HOMO (H)<HOMO (BD)
where LUMO (H) is an absolute value of a lowest unoccupied molecular orbital (LUMO) energy of the host material,
LUMO (BD) is an absolute value of a LUMO energy of the blue-light-emitting dopant material,
HOMO (H) is an absolute value of a highest occupied molecular orbital (HOMO) energy of the host material, and
HOMO (BD) is an absolute value of a HOMO energy of the blue-light-emitting dopant material.

6. The organic EL element according to claim 1, wherein the host material consists of a hydrocarbon.

7. The organic EL element according to claim 1, wherein the host material is an aromatic hydrocarbon compound that optionally has an alkyl group having 1 to 12 carbon atoms, and the aromatic hydrocarbon compound has a molecular structure including an aromatic hydrocarbon ring selected from the group consisting of a benzene ring, a naphthalene ring, a fluorene ring, a benzofluorene ring, a phenanthrene ring, a chrysene ring, a triphenylene ring, a pyrene ring, a fluoranthene ring, and a benzofluoranthene ring.

8. A lighting apparatus comprising:
a light source; and
a light diffusion unit or an optical filter,
wherein the light source includes the organic EL element according to claim 1.

9. A moving object comprising:
a body; and
a lighting fixture mounted to the body,
wherein the lighting fixture includes the organic EL element according to claim 1.

10. The organic EL element according to claim 1, further comprising a hole blocking layer disposed between the light-emitting layer and the second electrode, the hole blocking layer consisting of a hydrocarbon.

11. The organic EL element according to claim 10, further comprising an electron transport layer disposed between the hole blocking layer and the second electrode, the electron transport layer being made of a material having a pyridyl group or a phenanthrolyl group.

12. The organic EL element according to claim 1, further comprising an electron blocking layer disposed between the light-emitting layer and the first electrode, the electron blocking layer being made of a material having a carbazole skeleton.

13. The organic EL element according to claim 12, further comprising a hole transport layer disposed between the electron blocking layer and the first electrode.

14. A display device comprising a plurality of pixels, wherein at least one of the pixels includes the organic EL element according to claim 1 and an active element connected to the organic EL element.

15. An image pickup apparatus comprising:
an optical unit including a plurality of lenses;
an image pickup element that receives light that has passed through the optical unit; and
a display unit,
wherein the display unit displays information acquired by the image pickup element and includes the display device according to claim 14.

16. An electronic device comprising:
a housing;
a communication unit that communicates with an outside; and
a display unit,
wherein the display unit includes the display device according to claim 14.

17. An organic electroluminescent (EL) element comprising:
a first electrode;
a second electrode; and
a light-emitting layer disposed between the first electrode and the second electrode,
wherein the light-emitting layer includes a first light-emitting layer and a second light-emitting layer,
the first light-emitting layer contains a green-light-emitting dopant material, a blue-light-emitting dopant material and a first host material and emits green light and blue light, and
the second light-emitting layer contains a red-light-emitting dopant material, a green-light-emitting dopant material and a second host material and emits red light and green light;
wherein the first light-emitting layer satisfies relations (i) and (ii):
(i) LUMO (H)<LUMO (BD)
(ii) HOMO (H)<HOMO (BD)
where LUMO (H) is an absolute value of a lowest unoccupied molecular orbital (LUMO) energy of the host material,
LUMO (BD) is an absolute value of a LUMO energy of the blue-light-emitting dopant material, HOMO (H) is an absolute value of a highest occupied molecular orbital (HOMO) energy of the host material, and HOMO (BD) is an absolute value of a HOMO energy of the blue-light-emitting dopant material.

18. A display device comprising a plurality of pixels, wherein at least one of the pixels includes the organic EL element according to claim 17 and an active element connected to the organic EL element.

19. A lighting apparatus comprising:
a light source; and
a light diffusion unit or an optical filter,
wherein the light source includes the organic EL element according to claim 17.

20. An organic electroluminescent (EL) element comprising:
a first electrode;
a second electrode;
a light-emitting layer disposed between the first electrode and the second electrode; and
a hole blocking layer disposed between the light-emitting layer and the second electrode,
wherein the light-emitting layer includes a first light-emitting layer and a second light-emitting layer,
the first light-emitting layer contains a green-light-emitting dopant material, a blue-light-emitting dopant material and a first host material and emits green light and blue light, and
the second light-emitting layer contains a red-light-emitting dopant material, a green-light-emitting dopant material and a second host material and emits red light and green light;
wherein the hole blocking layer consists of a hydrocarbon.

21. A display device comprising a plurality of pixels, wherein at least one of the pixels includes the organic EL element according to claim 20 and an active element connected to the organic EL element.

22. A lighting apparatus comprising:
a light source; and
a light diffusion unit or an optical filter,
wherein the light source includes the organic EL element according to claim 20.

23. An organic electroluminescent (EL) element comprising:
a first electrode;
a second electrode;
a light-emitting layer disposed between the first electrode and the second electrode; and
an electron blocking layer disposed between the light-emitting layer and the first electrode,
wherein the light-emitting layer includes a first light-emitting layer and a second light-emitting layer,
the first light-emitting layer contains a green-light-emitting dopant material, a blue-light-emitting dopant material and a first host material and emits green light and blue light, and
the second light-emitting layer contains a red-light-emitting dopant material, a green-light-emitting dopant material and a second host material and emits red light and green light;
wherein the electron blocking layer includes a material having a carbazole skeleton.

24. A display device comprising a plurality of pixels, wherein at least one of the pixels includes the organic EL element according to claim 23 and an active element connected to the organic EL element.

25. A lighting apparatus comprising:
a light source; and
a light diffusion unit or an optical filter,
wherein the light source includes the organic EL element according to claim 23.

* * * * *